United States Patent
Van Haren et al.

(10) Patent No.: US 11,126,093 B2
(45) Date of Patent: Sep. 21, 2021

(54) FOCUS AND OVERLAY IMPROVEMENT BY MODIFYING A PATTERNING DEVICE

(71) Applicant: ASML NETHERLANDS B.V., Veldhoven (NL)

(72) Inventors: Richard Johannes Franciscus Van Haren, Waalre (NL); Reiner Maria Jungblut, Eindhoven (NL); Leon Paul Van Dijk, Eindhoven (NL); Willem Seine Christian Roelofs, Deurne (NL); Wim Tjibbo Tel, Helmond (NL); Stefan Hunsche, Santa Clara, CA (US); Maurits Van Der Schaar, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 506 days.

(21) Appl. No.: 16/099,452

(22) PCT Filed: May 17, 2017

(86) PCT No.: PCT/EP2017/061854
§ 371 (c)(1),
(2) Date: Nov. 7, 2018

(87) PCT Pub. No.: WO2017/202665
PCT Pub. Date: Nov. 30, 2017

(65) Prior Publication Data
US 2020/0310242 A1 Oct. 1, 2020

Related U.S. Application Data

(60) Provisional application No. 62/341,463, filed on May 25, 2016, provisional application No. 62/342,665, filed on May 27, 2016, provisional application No. 62/421,186, filed on Nov. 11, 2016.

(51) Int. Cl.
*G03F 7/20* (2006.01)
*G03F 1/36* (2012.01)
*G03F 9/00* (2006.01)

(52) U.S. Cl.
CPC ............ *G03F 7/70641* (2013.01); *G03F 1/36* (2013.01); *G03F 9/7026* (2013.01); *G03F 9/7034* (2013.01)

(58) Field of Classification Search
CPC ...... G03F 1/36; G03F 7/70641; G03F 9/7026; G03F 9/7034
USPC ...................................................... 430/5, 30
See application file for complete search history.

(56) References Cited

U.S. PATENT DOCUMENTS

| | | |
|---|---|---|
| 2004/0058255 A1 | 3/2004 | Jessen et al. |
| 2006/0066855 A1 | 3/2006 | Den Boef et al. |
| 2007/0224522 A1 | 9/2007 | Lee et al. |
| 2008/0032206 A1 | 2/2008 | Lee et al. |
| 2012/0009511 A1 | 1/2012 | Dmitriev |
| 2012/0194792 A1 | 8/2012 | Sapp et al. |
| 2012/0257184 A1 | 10/2012 | Mulkens |
| 2013/0157473 A1 | 6/2013 | Itoh |

FOREIGN PATENT DOCUMENTS

| | | |
|---|---|---|
| EP | 3255493 | 12/2017 |
| JP | 2010044287 | 2/2010 |
| WO | 2015144700 | 10/2015 |
| WO | 2018019496 | 2/2018 |

OTHER PUBLICATIONS

International Search Report and Written Opinion issued in corresponding PCT Patent Application No. PCT/EP2017/061854, dated Aug. 17, 2017.
La Fontaine, Bruno et al.: "Analysis of Focus Errors in Lithography Using Phase-Shift Monitors", Proc. of SPIE, vol. 4691, 2002.
Arosha, Goonesekera, et al.: "A study of closed-loop application: WLCD-CDC for 32nm and beyond reticles", Proc. of SPIE, vol. 8166, Nov. 3, 2011, pp. 1-10.

*Primary Examiner* — Christopher G Young
(74) *Attorney, Agent, or Firm* — Pillsbury Winthrop Shaw Pittman LLP

(57) ABSTRACT

A method is proposed involving obtaining data regarding an expected focus offset during a patterning process due to topography of a region of a substrate surface. A modification of, e.g., a transmission or reflection of a region of a patterning device associated with the region of the substrate surface is determined based on the data. Using the patterning device modified according the determined modification during the patterning process mitigates an impact of the substrate topography on a parameter of the patterning process.

20 Claims, 18 Drawing Sheets

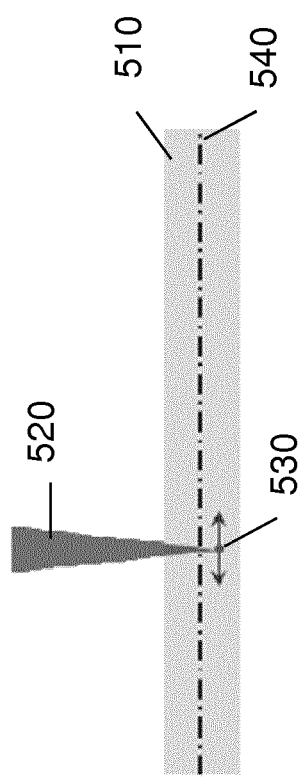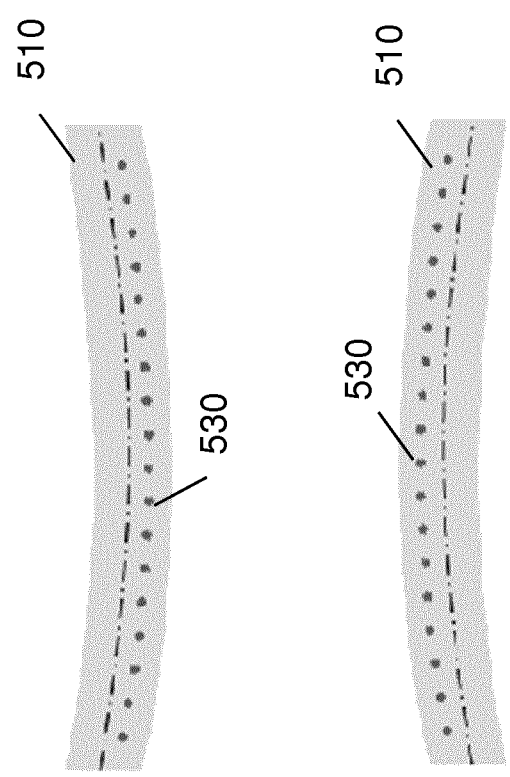
Fig. 5A
Fig. 5B
Fig. 5C

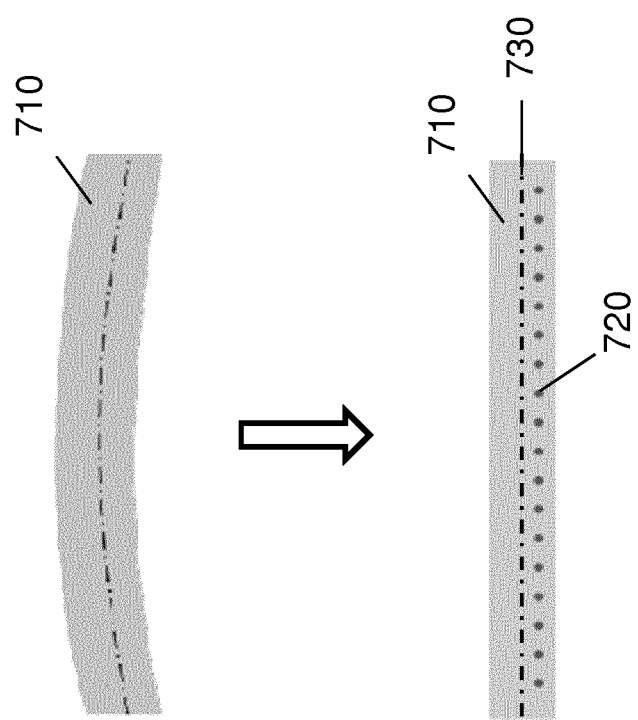
Fig. 7
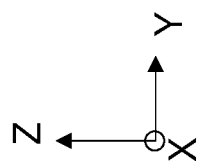

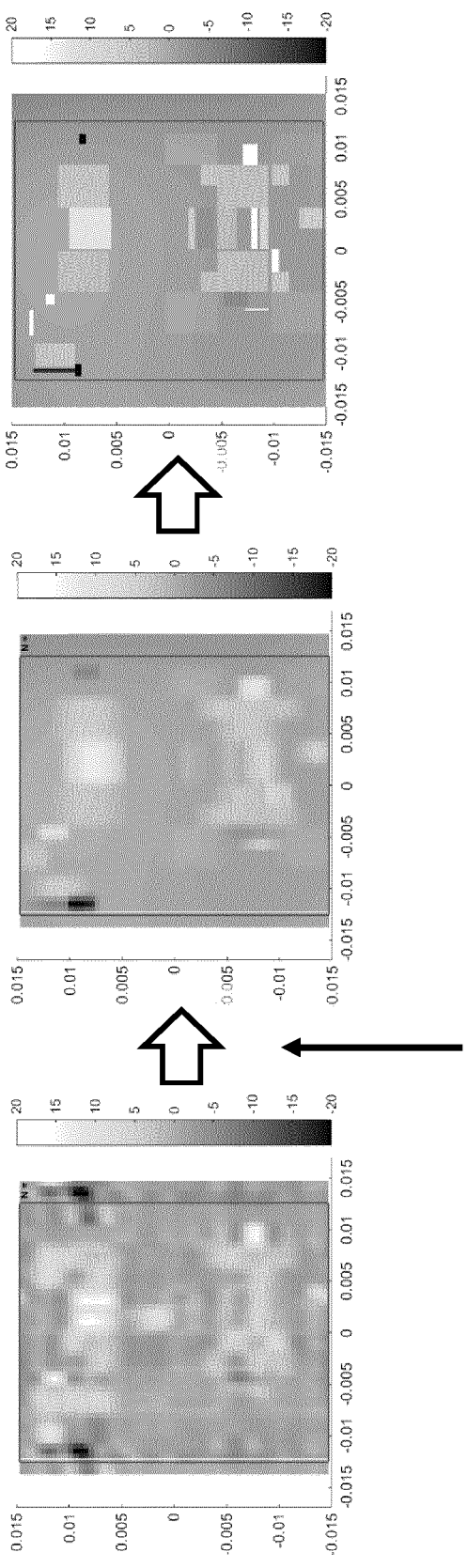
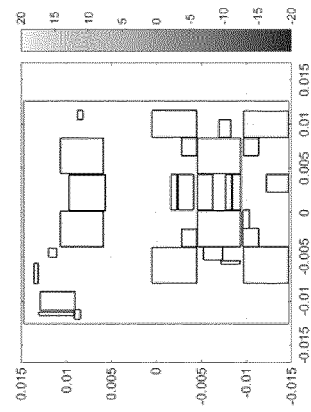
Fig. 11A Fig. 11B Fig. 11C Fig. 11D

FOCUS AND OVERLAY IMPROVEMENT BY MODIFYING A PATTERNING DEVICE

CROSS-REFERENCE TO RELATED APPLICATIONS

This application is the U.S. national phase entry of PCT patent application no. PCT/EP2017/061854, which was filed on May 17, 2017, which claims the benefit of priority of U.S. provisional application No. 62/341,463 which was filed on May 25, 2016, U.S. provisional application No. 62/342,665 which was filed on May 27, 2016, and U.S. provisional application No. 62/421,186 which was filed on Nov. 11, 2016, which are incorporated herein in their entireties by reference.

FIELD

The present description relates to a method and apparatus for modifying a patterning process error, such as focus error and/or overlay error by, for example, modifying a patterning device.

BACKGROUND

A lithographic apparatus is a machine that applies a desired pattern onto a substrate, usually onto a target portion of the substrate. A lithographic apparatus can be used, for example, in the manufacture of integrated circuits (ICs) or other devices designed to be functional. In that instance, a patterning device, which is alternatively referred to as a mask or a reticle, may be used to generate a circuit pattern to be formed on an individual layer of the device designed to be functional. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scan-ning"-direction) while synchronously scanning the substrate parallel or anti parallel to this direction. It is also possible to transfer the pattern from the patterning device to the substrate by imprinting the pattern onto the substrate.

SUMMARY

Manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching using the pattern using an etch apparatus, etc. Further, one or more metrology processes are involved in the patterning process.

Metrology processes are used at various steps during a patterning process to monitor and control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), the measurements of the one or more characteristics may be used to alter one or more parameters of the patterning process such that further substrates manufactured by the patterning process have an acceptable characteristic(s).

With the advancement of lithography and other patterning process technologies, the dimensions of functional elements have continually been reduced while the amount of the functional elements, such as transistors, per device has been steadily increased over decades. In the meanwhile, the requirement of accuracy in terms of overlay, critical dimension (CD), etc. has become more and more stringent. An error, such as a focus error, overlay error, etc., will inevitably be produced in the patterning process. For example, an imaging error may be produced from optical aberration, patterning device heating, a patterning device construction error, and/or substrate heating and can be characterized in terms of, e.g., focus error, overlay error, etc. Additionally or alternatively, an error may be introduced in other parts of the patterning process, such as in etch, development, bake, etc. and similarly can be characterized in terms of, e.g., focus error, overlay error, etc. The error may directly cause a problem in terms of the functioning of the device, including failure of the device to function or one or more electrical problems of a functioning device.

One or more apparatuses used in the patterning process may be used to correct (e.g., at least partially, if not wholly) one or more of the errors. For example, the lithographic apparatus may be able to correct a portion of the error by adjusting one or more actuators in the lithographic apparatus. But, a remaining error may not be correctable by the one or more actuators in the lithographic apparatus.

A shape or profile of the patterning device may be distorted or deformed before or during the patterning process, for example, misshapen or deformed by improper construction, misshapen or deformed when a pellicle is mounted to the patterning device, etc. In an embodiment, the shape is a cross-sectional shape of the patterning device perpendicular to the main plane of the patterning device on which the exposure radiation beam is incident. In an embodiment, the profile is of an exterior surface of the patterning device. In an embodiment, the profile is of a line passing through the body of the patterning device (e.g., at or near the center) and generally parallel to the main plane of the patterning device. In the following description, the shape and shape error will be focused on; however, all the concepts herein are equally applicable to a profile of the patterning device.

The shape error of the patterning device may produce an undesirable pattern on the substrate, and contribute to a patterning error (e.g., a focus error, overlay error, etc.), when the distorted patterning device is used in a patterning system (e.g., an optical lithographic apparatus). An existing patterning system may not be capable of modifying the patterning device intentionally to a desired shape nor may not be capable of making a correction within the patterning system to compensate for an error introduced by a misshapen patterning device.

Therefore, there is a desire for, for example, a cost effective method and/or an apparatus that can further or better correct an error, such as focus error, overlay error, etc., in the patterning process by modifying the shape of the patterning device.

In an embodiment, there is provided a method comprising: creating, by a computer system, modification information comprising a spatial distribution of induced local deformation elements and/or local transmission variations within, and displaced from a surface of, a body of the patterning device to modify a shape or profile of the patterning device, the modification information arranged to reduce a patterning error in a patterning system using the patterning device modified according to the modification information.

In an embodiment, there is provided a method comprising: reducing a focus and/or overlay error in a patterning system using a patterning device, by changing a profile of the patterning device by inducing a spatial distribution of local deformation elements and/or local transmission variations within, and displaced from a surface of, a body of the patterning device.

In an embodiment, there is provided a system comprising: a hardware processor system; and a non-transitory computer readable storage medium storing machine-readable instructions, wherein when executed, the machine-readable instructions cause the processor system to creating modification information comprising a spatial distribution of induced local deformation elements and/or local transmission variations within, and displaced from a surface of, a body of the patterning device to modify the shape or profile of the patterning device, the modification information arranged to reduce a patterning error in a patterning system using the patterning device modified according to the modification information.

In an embodiment, there is provided a system comprising: a hardware processor system; and a non-transitory computer readable storage medium storing machine-readable instructions, wherein when executed, the machine-readable instructions cause the processor system to reduce a focus and/or overlay error in a patterning system using a patterning device, by changing a profile of the patterning device by inducing a spatial distribution of local deformation elements and/or local transmission variations within, and displaced from a surface of, a body of the patterning device.

In an embodiment, there is provided a method comprising: obtaining data regarding an expected focus offset during a patterning process due to topography of a region of a substrate surface; and determining a modification of a transmission or reflection of a region of a patterning device associated with the region of the substrate surface based on the data, to mitigate an impact of the substrate topography on a parameter of the patterning process.

In an embodiment, there is provided a system comprising: a hardware processor system; and a non-transitory computer readable storage medium storing machine-readable instructions, wherein when executed, the machine-readable instructions cause the processor system to obtain data regarding an expected focus offset during a patterning process due to topography of a region of a substrate surface, and determine a modification of a transmission or reflection of a region of a patterning device associated with the region of the substrate surface based on the data, to mitigate an impact of the substrate topography on a parameter of the patterning process.

In an embodiment, there is provided a method comprising: creating, by a computer system, modification information comprising one or more induced local deformation elements and/or local transmission variations within, and displaced from a surface of, a body of the patterning device, such that a radiation transmission and/or a distance to a focal plane at the location of a first metrology target feature on the patterning device is different from the radiation transmission and/or distance to a focal plane at the location of a second metrology target feature on the patterning device.

In an embodiment, there is provided a method comprising: exposing a first metrology target feature and a second metrology target feature on a patterning device to a substrate using a patterning process, wherein a radiation transmission and/or a distance to a focal plane at the location of the first metrology target feature is different from the radiation transmission and/or distance to a focal plane at the location of the second metrology target feature; and determining a value of a parameter associated with the patterning process based on measurement of a) a characteristic at a location of the substrate associated with the exposed first metrology target feature and b) a characteristic at a location of the substrate associated with the second metrology target feature.

In an embodiment, there is provided a patterning device comprising a first metrology target feature, a second metrology target feature and one or more induced local deformation elements within, and displaced from a surface of, a body of the patterning device, such that a distance to a focal plane at the location of the first metrology target feature on the patterning device is different from the distance to a focal plane at the location of the second metrology target feature on the patterning device.

In an embodiment, there is provided a patterning device comprising a first metrology target feature, a second metrology target feature and one or more local transmission variations within, and displaced from a surface of, a body of the patterning device, such that a radiation transmission at the location of the first metrology target feature on the patterning device is different from the radiation transmission at the location of the second metrology target feature on the patterning device.

In an aspect there is provided a patterning device modified according to a method as described herein or used according to a method as described herein.

In an aspect, there is provided a system comprising: a hardware processor system; and a non-transitory computer readable storage medium storing machine-readable instructions, wherein when executed, the machine-readable instructions cause the processor system to cause execution of a method as described herein.

In an aspect, there is provided a non-transitory computer program product comprising machine-readable instructions for causing a processor system to cause performance of a method described herein.

BRIEF DESCRIPTION OF THE DRAWINGS

Embodiments will now be described, by way of example only, with reference to the accompanying drawings in which:

FIGS. 5A, 5B and 5C illustrate an example of modifying a shape of the patterning device using the patterning device modification system;

FIG. 7 schematically depicts an example of patterning device to patterning device matching using the patterning device modification system;

FIGS. 11A, 11B, 11C and 11D schematically depict a technique of determining topography;

DETAILED DESCRIPTION

Before describing embodiments in detail, it is instructive to present an example environment in which embodiments may be implemented.

Figure 1:
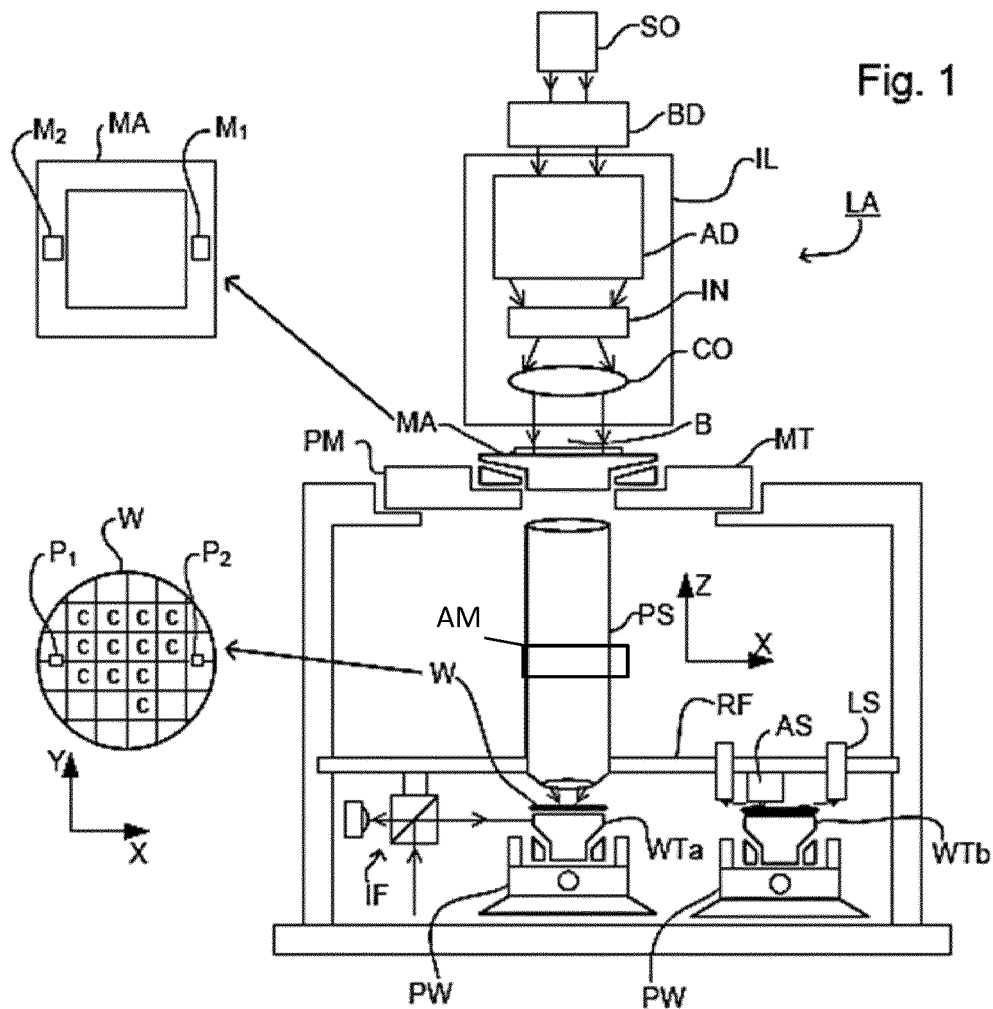
FIG. 1 schematically depicts an embodiment of a lithographic apparatus.

FIG. 1 schematically depicts a lithographic apparatus LA. The apparatus comprises:
- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WTa constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W, the projection system supported on a reference frame (RF).

The illumination system may include various types of optical components, such as refractive, reflective, magnetic, electromagnetic, electrostatic or other types of optical components, or any combination thereof, for directing, shaping, or controlling radiation.

The support structure supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WTa) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for an aberration (e.g., a phase variation across the pupil plane). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form asphere). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WTa can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WTa are kept essentially stationary, while an entire pattern imparted to the radiation beam is projected onto a target portion C at one time (i.e. a single static exposure). The substrate table WTa is then shifted in the X and/or Y direction so that a different target portion C can be exposed. In step mode, the maximum size of the exposure field limits the size of the target portion C imaged in a single static exposure.

2. In scan mode, the support structure MT and the substrate table WTa are scanned synchronously while a pattern imparted to the radiation beam is projected onto a target portion C (i.e. a single dynamic exposure). The velocity and direction of the substrate table WTa relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
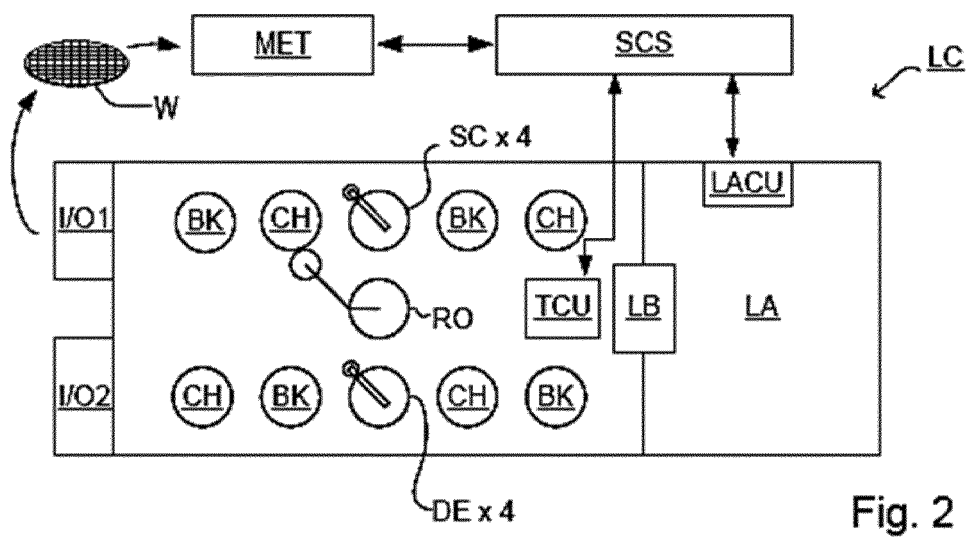
FIG. 2 schematically depicts an embodiment of a lithographic cell or cluster.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently, it is desirable to inspect an exposed substrate to measure one or more properties such as overlay error between subsequent layers, line thickness, critical dimension (CD), focus offset, a material property, etc. Accordingly a manufacturing facility in which lithocell LC is located also typically includes a metrology system MET which receives some or all of the substrates W that have been processed in the lithocell. The metrology system MET may be part of the lithocell LC, for example it may be part of the lithographic apparatus LA.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, an inspection apparatus is used to determine one or more properties of the substrate, and in particular, how one or more properties of different substrates vary or different layers of the same substrate vary from layer to layer. The inspection apparatus may be integrated into the lithographic apparatus LA or the lithocell LC or may be a stand-alone device. To enable rapid measurement, it is desirable that the inspection apparatus measure one or more properties in the exposed resist layer immediately after the exposure. However, the latent image in the resist has a low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of a faulty substrate but may still provide useful information.

In order to monitor the patterning process (e.g., a device manufacturing process) that includes at least one patterning step (e.g., an optical lithography step), the patterned substrate is inspected and one or more parameters of the patterned substrate are measured. The one or more parameters may include, for example, overlay error between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. There are various techniques for making measurements of the structures formed in the patterning process, including the use of a scanning electron microscope, image-based measurement or inspection tools and/or various specialized tools. A fast and non-invasive form of specialized metrology and/or inspection tool is one in which a beam of radiation is directed onto a target on the surface of the substrate and properties of the scattered (diffracted/reflected) beam are measured. By comparing one or more properties of the beam before and after it has been scattered by the substrate, one or more properties of the substrate can be determined. This may be termed diffraction-based metrology or inspection. A particular application of this diffraction-based metrology or inspection is in the measurement of feature asymmetry within a periodic target. This can be used as a measure of overlay error, for example, but other applications are also known. For example, asymmetry can be measured by comparing opposite parts of the diffraction spectrum (for example, comparing the −1st and +$1^{st}$ orders in the diffraction spectrum of a periodic grating). This can be done simply as is described, for example, in U.S. patent application publication US2006-066855, which is incorporated herein in its entirety by reference.

Significant aspects to enabling a patterning process include developing the process itself, setting it up for monitoring and control and then actually monitoring and controlling the process itself. Assuming a configuration of the fundamentals of the patterning process (such as the patterning device pattern(s), the resist type(s), post-lithography process steps (such as the development, etch, etc.), etc.), the lithographic apparatus is setup for transferring the pattern onto the substrates, one or more metrology targets are developed to monitor the process, a metrology process is setup to measure the metrology targets and then a process of monitoring and controlling the process based on measurements is implemented. As part of such an arrangement, in an embodiment, the shape of the patterning device is monitored and appropriate measures are taken, for example, modifying the patterning device to a desirable shape when needed. Further modification of the patterning device may be applied so that a remaining patterning error (such as focus error and/or overlay error) may be corrected within a desired tolerance. While discussion in this application will consider an embodiment of a metrology process and/or target designed to measure overlay between one or more layers of a device being formed on a substrate and/or focus error (i.e., a difference in best focus, relative to the substrate, of an optical system of the patterning system), embodiments herein are equally applicable to other metrology processes and/or targets, such as a metrology process and/or target to measure alignment between two objects (e.g., between a patterning device and a substrate), a metrology process and/or target to measure critical dimension, a metrology process and/or target to measure a position of a surface (e.g., a height and/or rotational position of a substrate surface using a level sensor), etc., and using such data in creating modification information for a modification apparatus of the patterning system or for a patterning device correction apparatus. Accordingly, the references herein to an overlay metrology target, overlay data, etc. should be considered as suitably modified to enable other kinds of metrology processes and/or targets.

Figure 3:
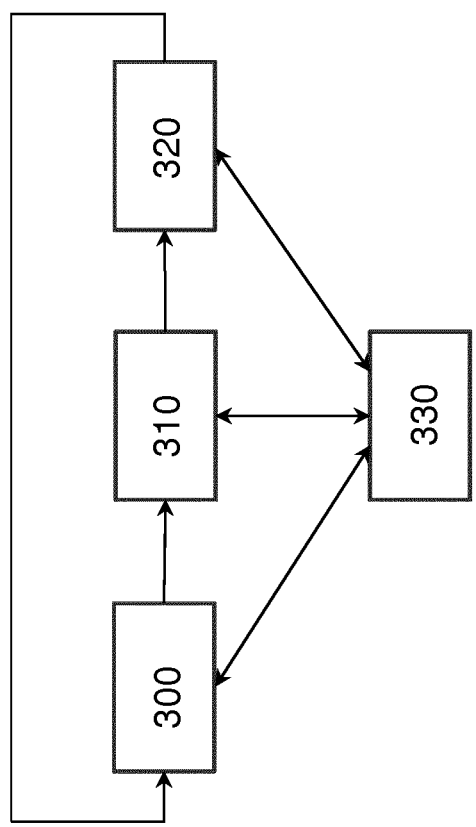
FIG. 3 schematically depicts an embodiment of a lithographic processing, metrology, and patterning device modification system.

Referring to FIG. 3, an embodiment of lithographic processing, metrology, and patterning device modification system is shown. The system comprises a patterning system (e.g., a nanoimprint lithography tool, an optical lithographic apparatus such as described in respect of FIG. 1, a track tool such as described in respect of FIG. 2, an etch tool, another apparatus in the patterning process, or any combination selected therefrom) 300, a metrology apparatus 310, a patterning device modification system 320, and a software application 330. Some, or all, of the patterning system 300, the metrology apparatus 310, and the patterning device modification system 320 are in communication with the software application 330 so that results, designs, data, etc. of the patterning system 300, the metrology apparatus 310, and/or the patterning device modification system 320 may be stored and analyzed by the software application 330 at the same time or different times.

As mentioned above, the patterning system 300 may be, or comprise, the lithographic apparatus LA in FIG. 1. The patterning system 300 may be setup for executing the patterning aspect of the patterning process. For example, the patterning system 300 may produce patterns on the substrate using a patterning device.

In an embodiment, the patterning system 300 may be configured to correct for deviations occurring within the patterning system 300 or in one or more other processes or apparatuses in the patterning process. In an embodiment, the patterning system 300 may be able to apply a correction of an error (e.g., imaging error, focus error, dose error, etc.) by adjusting one or more modification apparatuses of the patterning system 300. That is, in an embodiment, correction can be made by any manufacturing processing tool in the patterning system that can purposefully modify a patterning error.

In an embodiment, an error in respect of the patterning device can be corrected by reference to a measurement of the patterning device, measurement of a metrology target associated with the patterning device, or measurement of a structure supporting the patterning device (e.g., the structure itself or a metrology target on the structure). For example, two or more reticle shape correction (RSC) marks are provided at the periphery of the patterning device (outside the imaging field). The patterning system 300 may include a sensor (e.g., a transmission image sensor (TIS)) to receive radiation directed at the marks. For example, the sensor can be located on a movable table below the projection system to capture an aerial image produced by radiation illuminated on the RSC marks. The sensor can provide the measurements, or data based on the measurements, to a system to enable the peripheral shape of the patterning device to be determined. But, since the RSC marks are located at the periphery of the patterning device, shape information within the device pattern cannot be directly obtained; a shape of the device pattern portion can be determined by interpolation and/or extrapolation but will suffer from accuracy. The system that receives the measurements, or data based on the measurements, can be a control system of the patterning system to enable one or more modification apparatuses of the patterning system 300 to make a correction and/or can be the software application 330 to enable one or more modification apparatuses of the patterning system 300 to make a correction and/or enable the patterning device modification system 320 to make a modification of the patterning device.

Where, for example, the patterning system 300 comprises an optical lithographic apparatus, correction of an error can be made by adjusting one or more modification apparatuses of the lithographic apparatus, e.g., by employing the adjustment mechanism AM to correct for or apply an optical aberration, by employing the adjuster AD to correct or modify an illumination intensity distribution, by employing the positioner PM of the patterning device support structure MT and/or the positioner PW of the substrate table WTa to correct or modify the position of the patterning device support structure MT and/or the substrate table WTa respectively, etc. Where, for example, the patterning system 300 comprises a track tool, correction of an error can be made by adjusting one or more modification apparatuses of the track tool, e.g., modifying a bake temperature of a bake tool of the track, modifying a development parameter of a development tool of the track, etc. Similarly, where, for example, the patterning system 300 comprises an etch tool, correction of an error can be made by adjusting one or more modification apparatuses of the etch tool, e.g., modifying an etch parameter, such as etchant type, etchant rate, etc. Similarly, where, for example, the patterning system 300 comprises a planarization tool, correction of an error can be made by adjusting one or more modification apparatuses of the planarization tool, e.g., modifying a planarization parameter. Similarly, where, for example, the patterning system 300 comprises a deposition tool, correction of an error can be made by adjusting one or more modification apparatuses of the deposition tool, e.g., modifying a deposition parameter.

In an embodiment, one or more modification apparatuses of the patterning system 300 may be able to apply up to third order polynomial correction of an error (e.g., imaging error, focus error, dose error, etc.). In an embodiment, one or more modification apparatuses of the patterning system 300 may be able to apply up to fourth, fifth, sixth or seventh order polynomial correction of an error (e.g., imaging error, focus error, dose error, etc.).

After the patterning process, the patterning system 300 may forward one or more substrates exposed using the patterning device and/or the patterning device itself to a metrology apparatus 310 for measurement.

In an embodiment, the metrology apparatus 310 is configured to obtain measurements related to the patterning device. In an embodiment, for example, the metrology apparatus 310 makes measurements within the imaging field of the device pattern of the patterning device, such as registration error of the device pattern on the patterning device, measured focus data for the patterning device as described in more detail hereafter, and/or a surface figure of the patterning device as described in more detail hereafter. In an embodiment, the software application 330 determines the shape of the patterning device based on the image field measurements (i.e., corresponding to the imaging field of the patterning device). In an embodiment, the software application 330 determines a patterning device patterning error, associated with the patterning device, in a patterning system to form patterns on a substrate using the patterning device, based on the image field measurements. Such patterning device patterning error can be determined, for example, using a simulation of the exposure process, or by prior measurements of substrates patterned with the patterning device pattern. Optionally, data relating to the patterning device from a patterning system, such as measurements of the RSC marks by a sensor of the patterning system 300 (i.e., corresponding to the periphery of the patterning device), can be used to derive the shape and/or patterning error. In an embodiment, the patterning error comprises focus non-uniformity within an image field of the patterning device.

The software application 330 may further evaluate whether one or more values of the shape and/or patterning device patterning error of the patterning device is within a tolerance range of an applicable nominal value. If not, the software application 330 may create first modification information, based on the one or more values of the shape and/or patterning device patterning error of the patterning device, so that the patterning device modification system 320 may use the first modification information to modify the shape of the patterning device so that a difference (which in this context and other contexts below is not limited to subtraction) between the one or more values of the shape, the patterning device patterning error and/or the substrate patterning error (as described further below) of the modified patterning device and the applicable nominal value therefor is within a tolerance range. Thus, for example, the first modification information when applied by the patterning device modification system 320 results in the shape of the patterning device to match, or be closer, to a nominal shape and/or results in a patterning device patterning error to be reduced to equal to, or closer to, a nominal patterning device patterning error. In some examples, the nominal value may be a desired value of the shape and/or patterning device patterning error of the patterning device. In some examples, the nominal value may be a matching shape and/or patterning device patterning error to enable patterning device to patterning device matching, such as the shape and/or patterning device patterning error of another patterning device or an average shape and/or patterning device patterning error of two or more patterning devices. In some examples, the nominal value may be a desired value of the substrate patterning error associated with the patterning device. In some examples, the nominal value may be a matching substrate patterning error to enable patterning device to patterning device matching, such as the substrate patterning error of another patterning device or an average substrate patterning error of two or more patterning devices. More details about how the patterning device modification system 320 modifies the shape of the patterning device will be described in FIGS. 4-8.

Additionally or alternatively, the software application 330 may create first modification information, based on one or more values of the shape and/or patterning device patterning error of the patterning device, to adjust one or more modification apparatuses of the patterning system 300 so that a difference between one or more values of the shape, patterning device patterning error and/or substrate patterning error of the patterning device and the applicable nominal value therefor is within a tolerance range. For example, if the difference is entirely correctable by one or more modification apparatuses of the patterning system 300, then the first modification information may be exclusively modification information for one or more modification apparatuses of the patterning system 300. Or, if the difference comprises a component easily correctable by one or more modification apparatuses of the patterning system 300 and a component not so easily correctable, then the first modification information can comprise modification information for a patterning device modification 320 for the not easily correctable component and for one or more modification apparatuses of the patterning system 300 for the relatively easily correctable component.

In an embodiment, information related to a patterning error of one or more substrates processed in the patterning system is determined or measured. For example, in an embodiment, the metrology apparatus 310 is configured to obtain measurements related to one or more substrates printed with patterns using the patterning device in the patterning system 300 and from which such information related to the patterning error is determined. In an embodiment, the metrology apparatus 310 is configured to determine a patterning error (e.g., the overlay error and/or the focus error) in the patterning system associated with the patterning device by measuring patterns on one or more substrates produced using the patterning device by the patterning system 300 (e.g., scanning electron microscope (SEM) measurement, electrical test measurements, etc.). In an embodiment, the metrology apparatus 310 comprises a diffraction-based overlay metrology tool that can measure the one or more substrates to, e.g., determine overlay error, focus error, etc. In an embodiment, the metrology apparatus 310 can determine the patterning error across a substrate of the one or more substrates. In an embodiment, additionally or alternatively, information related to the patterning error in the patterning system can be derived from measurements in the patterning system itself associated with one or more substrates, such as focus information derived from level sensor measurements, positional data of a substrate during exposure (e.g., from measurement system IF), etc. In an embodiment, the substrate patterning error comprises focus non-uniformity within an image field of the patterning device.

In an embodiment, the software application 330 may evaluate whether one or more values of such substrate patterning error associated with the patterning device is within a tolerance range of an applicable nominal value. If not, the software application 330 may create second modification information, based on the one or more values of the substrate patterning error associated with the patterning device, so that the patterning device modification system 320 may use the second modification information to modify the shape of the patterning device so that a difference between the one or more values of the substrate patterning error of the modified patterning device and the applicable nominal value therefor is within a tolerance range. Thus, the second modification information when applied by the patterning device modification system 320 results in the substrate patterning error associated with the patterning device to match, or be closer, to a nominal substrate patterning error. In some examples, the nominal value may be a desired value of the substrate patterning error associated with the patterning device. In some examples, the nominal value may be a matching substrate patterning error to enable patterning device to patterning device matching, such as the substrate patterning error of another patterning device or an average substrate patterning error of two or more patterning devices.

Additionally or alternatively, the software application 330 may create second modification information, based on one or more values of the substrate patterning error associated with the patterning device, to adjust one or more modification apparatuses of the patterning system 300 so that a difference between one or more values of the substrate patterning error associated with the patterning device and the applicable nominal value therefor is within a tolerance range. For example, if the difference is entirely correctable by one or more modification apparatuses of the patterning system 300, then the second modification information may be exclusively modification information for one or more modification apparatuses of the patterning system 300. Or, if the difference comprises a component easily correctable by one or more modification apparatuses of the patterning system 300 and a component not so easily correctable, then the second modification information can comprise modification information for a patterning device modification 320 for the not easily correctable component and for one or more modification apparatuses of the patterning system 300 for the relatively easily correctable component.

In an embodiment, the substrate patterning error is determined for one or more substrates processed using a patterning device modified and/or used in accordance with the first and/or second modification information. Thus, successive modification information can be determined and applied.

In an embodiment, the substrate patterning error is differentiated from a shape error of the patterning device and/or a patterning device patterning error of the patterning device. For example, in an embodiment, the substrate patterning error is processed such that it is substantially unrelated to such shape error of the patterning device and/or patterning device patterning error of the patterning device. For example, in an embodiment, where the software application 330 only has shape information, the software application 330 determines the substrate patterning error (e.g., overlay error and/or focus error) produced by the shape error of the patterning device. The software application 330 determines the substrate patterning error by subtracting the determined substrate patterning error produced by the shape error of the patterning device or the patterning device patterning error, from the measured substrate patterning error.

For another example, in an embodiment, a qualification patterning device is used to determine the substrate patterning error that is substantially unrelated to the shape error of the patterning device and/or a patterning device patterning error of the patterning device. The qualification patterning device may be a custom patterning device having a nominal shape which is used to determine the substrate patterning error (e.g., overlay error, focus error, etc.) that is substantially unrelated to the shape error of the patterning device and/or a patterning device patterning error of the patterning device. For example, a focal qualification patterning device with the nominal shape can be used to determine the focus error (as the substrate patterning error). In an embodiment, the focal qualification patterning device is able to form a custom pattern to determine focus error. In an embodiment, the custom pattern comprises two concentric structures and one or more phase elements are arranged in the focal qualification patterning device so that any focus error is translated into an alignment error between the two concentric structures printed on the substrate, which can be measured with a metrology tool. More details about this approach is described in Bruno Fontaine, et al., "Analysis of Focus Errors in Lithography Using Phase-Shift Monitors," SPIE Proceedings on Optical Microlithography XV 4691 (2002), which is incorporated herein in its entirety by reference.

In an embodiment, the software application 330 creates only the first modification information. In an embodiment, the software application 330 creates only the second modification information. In an embodiment, the software application 330 creates the first and second modification information.

In an embodiment, to create the first and/or second modification information, the software application 330 uses one or more mathematical models to determine error correctable by one or more modification apparatuses of the patterning system 300 and to provide information for one or more parameters (e.g. modification information) of the one or more modification apparatuses of the patterning system 300, which one or more parameters enable configuration of the one or more modification apparatuses of the patterning system 300 to correct (e.g., eliminate or reduce to within a tolerance range) the error. In an embodiment, one or more of the mathematical models define a set of basis functions that fit the data once parameterized. In an embodiment, the one or more mathematical models comprise a model configured to simulate correctable error for the patterning system 300. In an embodiment, the model specifies a range of modifications that one or more of the modification apparatuses of the patterning system 300 can make and determines correctable error within the range. That is, the range may specify an upper limit, a lower limit, and/or both on the amount of modifications that a particular modification apparatus of the patterning system 300 can make.

In an embodiment, to create the first and/or second modification information, the software application 330 uses one or more mathematical models to determine error correctable by the patterning device modification system 320 and to provide information for one or more parameters (e.g. modification information) of the patterning device modification system 320, which one or more parameters enables configuration of the patterning device modification system 320 to correct (e.g., eliminate or reduce to within a tolerance range) the error. In an embodiment, one or more of the mathematical models define a set of basis functions that fit the data once parameterized. In an embodiment, the one or more mathematical models comprise a model configured to simulate correctable error for the patterning device modification system 320. In an embodiment, the model specifies a range of modifications that the patterning device modification system 320 can make and determines correctable error within the range. That is, the range may specify an upper limit, a lower limit, and/or both on the amount of modifications that the patterning device modification system 320.

In an embodiment, co-optimization of the determination of the error correctable by respectively one or more modification apparatuses of the patterning system 300 and correctable by the patterning device modification system 320 is provided. In an embodiment, co-optimization of the determination of the error correctable by a plurality of modification apparatuses of the patterning system 300 is provided. In an embodiment, the one or more mathematical models to determine error correctable by one or more modification apparatuses of the patterning system 300 and/or the one or more mathematical models to determine error correctable by the patterning device modification system 320 are used and/or combined to enable the co-optimization. In an embodiment, the co-optimization leads to transformation of a non-correctable error by a modification apparatus of the patterning system 300 to a correctable error by one or more other modification apparatuses of the patterning system 300 and/or by a modification of the patterning device by a patterning device modification system 320. As an example of such transformation, an error having an uncorrectable spatial resolution for a modification apparatus of the patterning system 300 can be enabled for correction by adding further error such that the total error has a spatial resolution correctable by the modification apparatus of the patterning system 300. In an embodiment, the added error is divided among a plurality of other modification apparatuses of the patterning system 300 or divided among one or more other modification apparatuses of the patterning system 300 and the patterning device modification system 320. In an embodiment, the co-optimization leads to transformation of a first correctable error by a modification apparatus of the patterning system 300 to a second correctable error by the modification apparatus of the patterning system 300 by a modification of the patterning device utilizing a patterning device modification system 320. As an example of such a transformation, a first correctable error leaving a first correction range of a modification apparatus of the patterning system 300 can be transformed such that the second correctable error leaves a second correction range of the modification apparatus of the patterning system 300, wherein the second correction range enables a further reduction of patterning error.

In an embodiment, the co-optimization is performed separately or on a combined basis for different types of error, such as performed separately or on a combined basis for overlay error, focus error, dose error, etc. In an embodiment, certain modification apparatuses of the patterning system 300 may be better able to correct certain types of error and so the error correction is appropriately weighted or apportioned among the suitable different modification apparatuses of the patterning system 300.

In an embodiment, a user may specify the one or more mathematical models from a collection of a plurality of mathematical models, whether that mathematical model is determined to be a fit or not. For example, an interface (such as a graphical user interface) may allow the user to specify the mathematical data model for consideration. In an embodiment, a plurality of measurement mathematical data models is determined or specified. In an embodiment, the one or more mathematical models may be tuned for optimal noise suppression (e.g., eliminating redundant orders or reducing the use of higher orders).

For example, in an embodiment, the correctable error $\Delta x$ in an x direction at the coordinate (x,y), is modeled by:

$$\Delta x = k_1 + k_3 x + k_5 y + k_7 x^2 + k_9 xy + k_{11} y^2 + k_{13} x^3 + k_{15} x^2 y + k_{17} xy^2 + k_{19} y^3 \quad (1)$$

where k1 is a parameter (that may be constant), and k3, k5, k7, k9, k11, k13, k15, k17, and k19 are parameters (that may be constant) for the terms x, y, $x^2$, xy, $y^2$, $x^3$, $x^2y$, $xy^2$, and $y^3$, respectively. One or more of k1, k3, k5, k7, k9, k11, k13, k15, k17, and k19 may be zero.

Relatedly, in an embodiment, the correctable error $\Delta y$ in a y direction at the coordinate (x,y), is modeled by:

$$\Delta y = k_2 + k_4 y + k_6 x + k_8 y^2 + k_{10} yx + k_{12} x^2 + k_{14} y^3 + k_{16} y^2 x + k_{18} yx^2 + k_{20} x^3 \quad (2)$$

where $k_2$ is a parameter (that may be constant), and $k_4$, $k_6$, $k_8$, $k_{10}$, $k_{12}$, $k_{14}$, $k_{16}$, $k_{18}$, and $k_{20}$ are parameters (that may be constant) for the terms y, x, $y^2$, yx, $x^2$, $y^3$, $y^2x$, $yx^2$, and $x^3$, respectively. One or more of $k_2$, $k_4$, $k_6$, $k_8$, $k_{10}$, $k_{12}$, $k_{14}$, $k_{16}$, $k_{18}$, and $k_{20}$ may be zero.

In an embodiment, at least part of the correctable error is corrected by the patterning system 300 through adjusting one or more of the modification apparatuses of the patterning system 300. So, in an embodiment, a portion of the error that fits the mathematical model is correctable by the patterning system 300 by adjusting one or more modification apparatuses of the patterning system 300.

A minimum remaining systematic variation for certain substrates processed in a patterning process may be specific to particular sub-processes or devices used in the processing of the substrates. The minimum remaining systematic variation is sometimes referred to as a fingerprint. The fingerprint may not be correctable by one or more modification apparatuses of the patterning system 300. In an embodiment, the fingerprint is corrected by modifying the patterning device using the patterning device modification system 320. In an embodiment, remaining systematic variation between the measurement data and the corresponding data calculated using the model (1) and model (2) is minimized by optimizing parameters (e.g., one or more of $k_1$-$k_{20}$).

In an embodiment, the software application 330 creates the first and/or second modification information for modifying the patterning device by the patterning device modification system 320 and transmits the first and/or second modification information to the patterning device modification system 320. In an embodiment, the first and/or second modification information effectively transforms non-correctable error by the patterning system 300 to a correctable error for the patterning system 300 upon modification by the patterning device based on the first and/or second modification information. In an embodiment, after modifying the patterning device, the software application 330 instructs the patterning device modification system 320 to transmit the modified patterning device to the patterning system 300 for use, in for example, production. In an embodiment, further error correction and/or verification of the modified patterning device is performed as discussed herein.

In an embodiment, the software application 330 further creates third modification information for one or more modification apparatuses of the patterning system 300 and transmits the third modification information to the patterning system 300. In an embodiment, the third modification information enables correction of correctable error of the patterning process by the one or more modification apparatuses of the patterning system 300 upon adjustment, based upon the third modification information, of the patterning process by the one or more modification apparatuses of the patterning system 300 and use of the modified patterning device in the patterning system 300. That is, in an embodiment, one or more modification apparatuses of the patterning system 300 are configured to correct the correctable error produced by the patterning device modified based on the first and/or second modification information. In an embodiment, additionally or alternatively, the third modification information corrects residual patterning error remaining after modification of the patterning device based on the first and/or second modification information.

In an embodiment, after the patterning device modification system 320 modifies the patterning device based on the first and/or the second modification information, the patterning device is transferred back to the patterning system 300 to repeat the process described above until the shape of the patterning device and/or the patterning error (e.g., the overlay error and/or the focus error) are within tolerance.

Figure 4B:
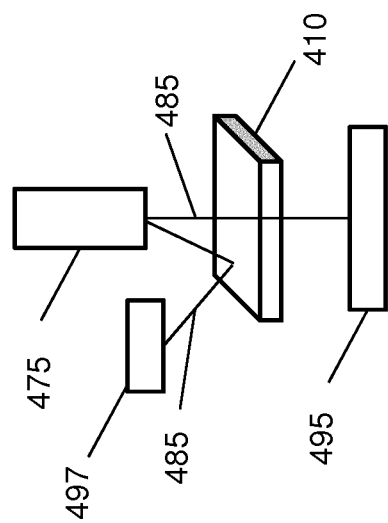
FIG. 4B schematically depicts an embodiment of a patterning device metrology system.
Figure 4A:
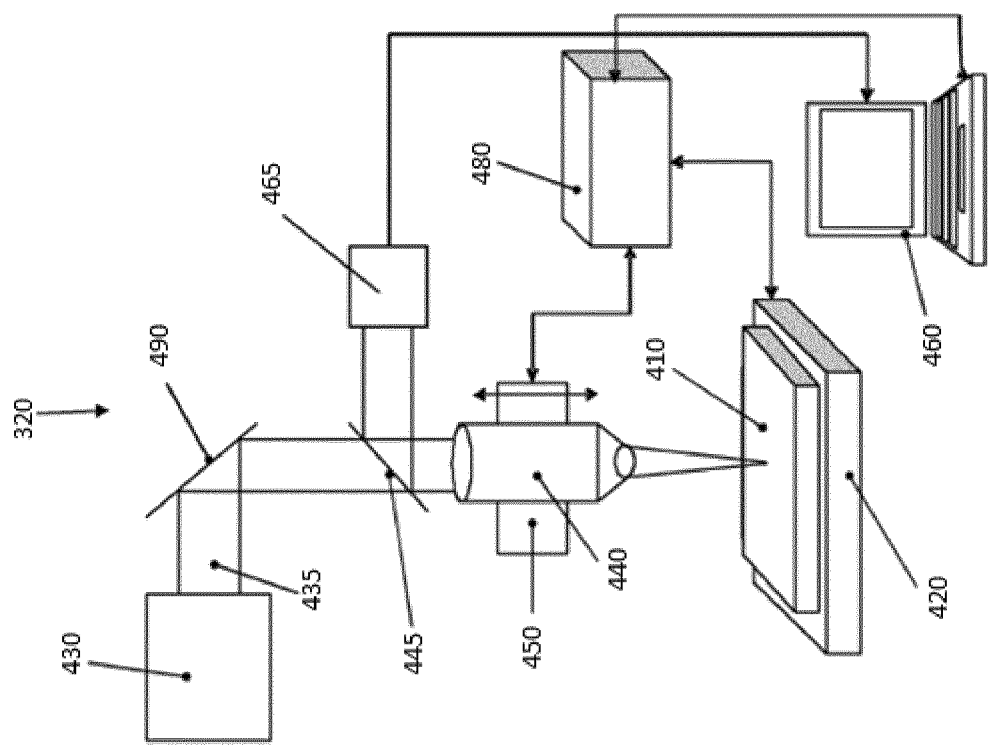
FIG. 4A schematically depicts an embodiment of a patterning device modification system.

FIG. 4A schematically depicts a block diagram of an example patterning device modification system 320 configured to modify a substrate of a patterning device (e.g., a photolithographic mask, an imprint template for nanoimprint lithography, etc.). The patterning device modification system 320 comprises a table 420 which may be movable in up to six dimensions. The patterning device 410 may be held by the table 420 by using, for example, clamping.

The patterning device modification system 320 includes a radiation output (e.g., a pulse laser source) 430 configured to provide a beam of radiation 435 (e.g., pulses of radiation). The output 430 provides radiation pulses of variable duration. Typically, the output is configured to provide radiation with a photon energy which is smaller than the band gap of the substrate of the patterning device 410 and able to provide radiation with pulses having durations in the femtosecond range.

The femtosecond or ultra-short radiation pulses from the output 430 (e.g., a laser system) can, for example, write an arrangement of local deformation elements (e.g., local density variation) and/or local transmission variations in the substrate of the patterning device by altering a materials property (e.g., density) of that substrate. The local deformation element may, for example, shift one or more pattern elements on the surface of the patterning device to a predetermined position. Thus, the induced deformation element of the substrate of the patterning device can modify or correct, for example, pattern placement on the surface of the patterning device. Additionally or alternatively, an arrangement of local transmission variations can be written in the substrate of the patterning device which modifies or corrects optical transmission of radiation passing through the patterning device. In this manner, modifications or corrections can be implemented without inducing a shift of one or more pattern elements on the surface of the substrate of the patterning device. An arrangement of local deformation elements and/or local transmission variations can be defined and written which modifies or corrects pattern placement and optical transmission. In an embodiment, the local deformation elements and/or local transmission variations may be introduced in a central or inner portion of the substrate of the patterning device. Applying such local deformation elements and/or local transmission variations in a central or inner portion of the substrate of the patterning device may avoid a bending of a portion of the patterning device substrate, while modifying or correcting pattern placement and/or optical transmission.

The steering mirror 490 directs the beam 435 into focusing objective 440. The objective 440 focuses the beam 435 onto the patterning device 410. The patterning device modification system 320 also includes a controller 480 and a computer system 460 which manage the translations of the positioning stage of the table 420 in plane generally perpendicular to the beam (x and/or y directions) and/or translations about an axis parallel to the plane (about the x and/or y direction). The controller 480 and the computer system 460 may control the translation of the table 420 in a direction perpendicular to the plane (z direction) and/or rotation about that direction (about the z direction). Additionally or alternatively, the controller 480 and the computer system 460 may control the translation and/or rotations of the objective 440 via the positioning stage 450 to which the objective 440 is fixed. In an embodiment, the objective is fixed and all motions are performed using the table 420. In an embodiment, the patterning device modification system 320 may comprise one or more sensors (not shown for convenience only) to detect positions of components, such as the table 420 and/or objective 440, determine focusing/leveling, etc.

The patterning device modification system 320 may also provide a viewing system including a CCD (charge-coupled device) camera 465, which receives radiation from an illumination output (e.g., radiation source) arranged in the table 420 via optical element 445. The viewing system facilitates navigation of the patterning device 410 to the target position. Further, the viewing system may also be used to observe the formation of a modified area on the substrate material of the patterning device 410 by the beam 435 of the output 430.

The computer system 460 may be a microprocessor, a general purpose processor, a special purpose processor, a CPU (central processing unit), a GPU (graphic processing unit), or the like. It may be arranged in the controller 480, or may be a separate unit such as a PC (personal computer), a workstation, a mainframe, etc. The computer 460 may further comprise I/O (input/output) units like a keyboard, a touchpad, a mouse, a video/graphic display, a printer, etc. In addition, the computer system 460 may also comprise a volatile and/or a non-volatile memory. The computer system 460 may be realized in hardware, software, firmware, or any combination thereof. Moreover, the computer 460 may control the output 430. The computer system 460 may contain one or more algorithms, realized in hardware, software or both, which allow creation of control signals for the patterning device modification system 320 from received data, e.g., experimental data. The control signals may control the writing of an arrangement of local deformation elements and/or local transmission variations in the substrate of the patterning device 410 in order to, for example, correct the pattern placement or optical transmission in accordance with the received data. In particular, the computer system 460 may control the output 430 and/or the table 420 positioning and/or the objective 440 positioning or optical parameters and/or the CCD camera 465.

FIG. 4B schematically depicts a block diagram of an example patterning device metrology system to measure the patterning device. In an embodiment, the patterning device metrology system is part of the patterning device modification system 320. The patterning device metrology comprises a radiation output (e.g., a laser source) 475 configured to provide a measurement beam of radiation 485 to the substrate of the patterning device 410. Further, the patterning device metrology system includes a sensor 495 configured to receive at least part of the measurement beam after it is incident on the patterning device 410. Using the measurement beam 485 in combination with sensor 495, a registration error and/or focus data can be determined. For example, the registration error can be determined by detecting features on the patterning device in combination with knowledge of the position (e.g., x, y position) of the patterning device 410 in relation to the beam 485. The measured positions of features can be compared with expected positions of features to determine a registration error. A map of registration error across the patterning device can be determined. As another example, focus data can be determined by using sensor 495 to determine to what extent the patterning device causes a focus point of beam 485 to shift (which could be accomplished while determining registration error). Similarly, a map of focus data across the patterning device can be determined. Additionally or alternatively, a surface figure of the patterning device can be determined by using beam 485 and detector 497. In an embodiment, the beam 485 and detector 497 form an interferometer system. A map of the surface figure across the patterning device can be determined. Through the use of the registration error, focus data and/or surface figure, a shape and/or patterning device patterning error of the patterning device can be determined.

In an embodiment, the effects of local deformation elements and/or local transmission variations may be described by a physical mathematical model that represents the deformation or variation caused by the beam. The direction of the deformation or variation is controlled by applying different local deformation elements and/or local transmission variations in the substrate having different deformation or variation properties. The deformation or variation properties of a given local deformation element and/or local transmission variation, such as magnitude and direction represent a specific mode. For example, an "X mode" represents a deformation or variation along the x axis and is described by the "X mode" properties. When the control signals are calculated, the one or more algorithms compute where and in what density each type of local deformation element and/or local transmission variation should be written. For example, a registration error in the x direction can be corrected by an X mode type of local deformation element and/or local transmission variation. The model can use several modes in order to optimize a best possible solution for a specific problem. Typically X and Y modes which are orthogonal to each other will be used but other modes such as 45° and 135° may also be used if required.

So, in an example patterning device production process, a pattern of absorbing elements is written on an absorbing layer on the substrate of a patterning device with a pattern generator. In a subsequent etching process, the absorbing pattern elements are formed from the absorbing material. A material often used for the absorbing layer on patterning devices is chromium or tungsten.

In an example patterning device modification process, the positions of the generated absorbing pattern elements may be determined with a registration metrology system (e.g., as described above in respect of FIG. 4B) in order to determine whether, e.g., the pattern writing process was successful, i.e. the pattern elements have their predetermined size and form and are at the desired positions. Additionally or alternatively, as discussed herein, one or more patterning errors may be determined (e.g., by measurement and/or simulation). If the determined error is not within a predetermined level, an arrangement of local deformation elements and/or local transmission variations are written into the substrate of the patterning device using, for example, the patterning device modification system 320 of FIG. 4A. The local deformation elements can shift the position of one or more pattern elements in or on the patterning device to a predetermined position and the local transmission variations can cause one or more pattern elements to behave differently in terms of imparting a pattern to the beam. Then, it may be measured whether the modification of the patterning device was successful. For example, if the measured positioning error is now below the predetermined threshold, the patterning device may be further processed (e.g., the addition of a pellicle) or used directly in production.

In an embodiment, the patterning device modification system 320 comprises the tool that writes the pattern of the patterning device. For example, an e-beam writer may be used to create the pattern of the patterning device. The modification information described herein may be provided to such a tool to modify creation of the patterning device. In such a case, the modification information may be determined based on measurement and/or simulation results using other copies of the patterning device or using similar patterning devices. Such data may be supplemented by measured data of the patterning device that is being created (e.g., measurements obtained at the time of creation of the patterning device).

The local deformation elements and/or local transmission variations as described above are normally created around the center plane of the patterning device or at the external surface of the patterning device to modify, for example, a registration error. Thus, the shape of the patterning device is not changed. But, when the local deformation elements and/or local transmission variations are created above or below the center plane of the patterning device, the patterning device can be made to bend. This feature may be used to modify the patterning device to a desired shape by the patterning device modification system 320.

FIGS. 5A, 5B and 5C illustrate an example of modifying a shape of the patterning device using a patterning device modification system (e.g., the patterning device modification system 320). As shown in FIG. 5A, a patterning device 510 can have a certain shape (e.g., a uniform shape such t that the patterning device is flat as shown in FIG. 5A) just prior application of one or more local deformation elements and/or local transmission variations as depicted in FIG. 5A. That is, in an embodiment, the patterning device modification system (not shown) applies a radiation beam 520 as shown in FIG. 5A to create a plurality of local deformation elements and/or local transmission variations 530 in the patterning device 510 below the center plane 540. As a result, the patterning device 510 is bent downward due to the addition of the local deformation element and/or local transmission variation as shown in FIG. 5B. The bend shown in FIG. 5B is depicted as significantly exaggerated to demonstrate the principle; in practice, the bend will be on the order of microns or nanometers. In an embodiment, when a plurality of local deformation elements and/or local transmission variations 530 are created above the center plane 540 of the patterning device 510, the patterning device 510 is bent upward as shown in FIG. 5C. Further, by creating a suitable number of the local deformation elements and/or local transmission variations 530 each at the appropriate locations in the patterning device 510 (i.e., above and/or below the center plane 540), the patterning device modification system can modify the patterning device 510 to a desired shape. That is, in an embodiment, the shape of the patterning device 510 is modified by the suitable number of the local deformation elements and/or local transmission variations 530 each at the appropriate locations in the patterning device 510. For example, if a cross-sectional shape is nominally a rectangular shape that has been deformed toward a crescent-type shape, the shape can be modified back to, or towards, the rectangular shape. As another, if a cross-sectional shape is nominally a rectangular shape that has been deformed toward a shape with wavy sides such that a center line between the wavy sides has a wavy shape, the shape can be modified back to, or towards, the rectangular shape. Although not shown, the patterning device modification system may further create a plurality of local deformation elements and/or local transmission variations 530 in the central plane 540 of the patterning device 510; by doing so, a patterning error may be modified accordingly. However, local deformation elements and/or local transmission variations at the central plane would not change the shape of the patterning device 510.

Figure 6B:
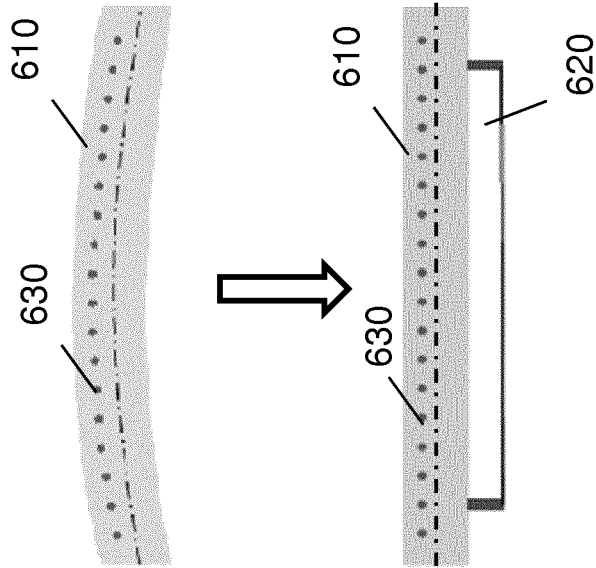
FIGS. 6A and 6B schematically depict an example of modifying a shape of a patterning device using the patterning device modification system when a pellicle frame configured to support a pellicle is mounted to the patterning device.
Figure 6A:
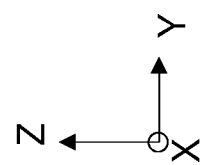
Figure 6A:
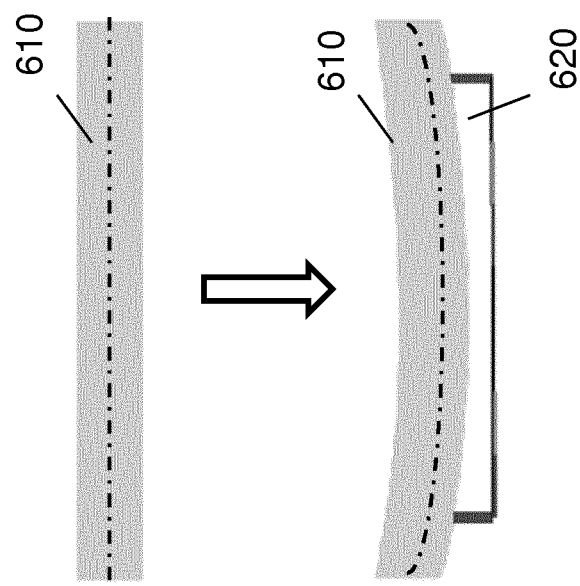

Modifying the shape of one or more patterning devices may be desirable and required in some examples. FIGS. 6A and 6B schematically depict examples of modifying a shape of a patterning device using the patterning device modification system when a pellicle frame, configured to support a pellicle, is mounted to the patterning device. As shown in FIG. 6A, a patterning device 610 has an original nominal shape (e.g., flat as shown in FIG. 6A). However, after mounting of a pellicle frame 630 supporting a pellicle 620, the patterning device 610 is bent downward. Such distortion in shape of the patterning device 610 arises due to the stress induced by the pellicle 620 and/or pellicle frame 630. The pellicle 620 is a thin and essentially transparent membrane placed above and/or below the patterning device to protect the patterning device from particulate contamination. Particles on the pellicle are significantly out of focus and thus have a reduced chance of impacting the patterning quality of the patterning system (e.g., the patterning system 300) using the patterning device. The distorted patterning device 610 may thereby produce distorted patterns on the substrate.

Pre-distorting the shape of the patterning device 610 may solve the problem. For example, a software application (e.g., the software application 330) may determine the distortion in shape in FIG. 6A, i.e., a difference between the nominal shape (flat) and the distorted shape (bent) in the presence of the pellicle 620 of the patterning device 610. For example, the patterning device 610 can be measured using a patterning device metrology system (such as in FIG. 4B or by a dedicated off-line metrology apparatus) before, and after, application of the pellicle 620 and use the data from each measurement to determine the distortion. The software application may further create the modification information based on the determined distortion in shape so that the patterning device modification system (e.g., the patterning device modification system 320) may modify the shape of the patterning device in the absence of the pellicle 620 according to the modification information. As a result, the patterning device no longer has the nominal shape (i.e., flat). But, the shape of the patterning device 610 may return to the nominal shape after the pellicle 620 is mounted to the patterning device 610 as shown in FIG. 6B.

In the patterning process, patterning device to patterning device matching may be performed by modifying the shape(s) of one or more patterning devices. In an example use case, multiple patterning devices are used to process a same layer of a substrate by a same patterning system (or by different patterning systems). For example, this use case may be for a double, triple, quadruple, etc. patterning application. In this use case, it is desirable that the multiple patterning devices have a similar shape, which shape may not be an ideal shape (e.g., a flat patterning device). This can be done by modifying the shape(s) of one or more patterning devices.

In another use case, multiple copies of the same patterning device are used to process a same layer on, for example, a same substrate or on different substrates, by a same patterning system (or by different patterning systems). For example, the multiple copies can enable patterning of the same type of device on multiple patterning systems or, when a copy of a patterning device is broken or does not function well, another copy of the same patterning device may be used to replace the defective copy. In this use case, it is desirable that the multiple copies of the same patterning device have a similar shape. This can be done by modifying the shape(s) of one or more patterning devices.

FIG. 7 schematically depicts an example of patterning device to patterning device matching using a patterning device modification system. As shown in FIG. 7, a patterning device 710 is originally bent upward. It is desirable to modify the shape of the patterning device 710 to, or close to, a certain matching shape (which is shown as generally flat in FIG. 7 but in an embodiment, is not perfectly flat). The matching shape may be the shape of another patterning device, may be an average shape of two or more patterning devices, etc. The patterning device modification system (e.g., the patterning device modification system 320) may be used to modify the shape of the patterning device 710 to, or close to, the matching shape. For example, a software application (e.g., the software application 330) may determine the difference between the original shape (i.e., bent downwardly) and the matching shape (i.e., close to, but not exactly, flat) in FIG. 7. The software application may further create the modification information based on the determined difference in shape so that the patterning device modification system (e.g., the patterning device modification system 320) may modify the shape of the patterning device 710 accordingly by, e.g., projecting radiation into the substrate of the patterning device 710 to generate local deformation elements and/or local transmission variations at the appropriate locations of the patterning device 710 according to the modification information. As shown in the example of FIG. 7, the patterning device modification system generates a plurality of local deformation elements and/or local transmission variations 720 below the central plane 730 of the patterning device 710 so that the shape of the patterning device 710 is modified toward the matching shape.

Figure 8:
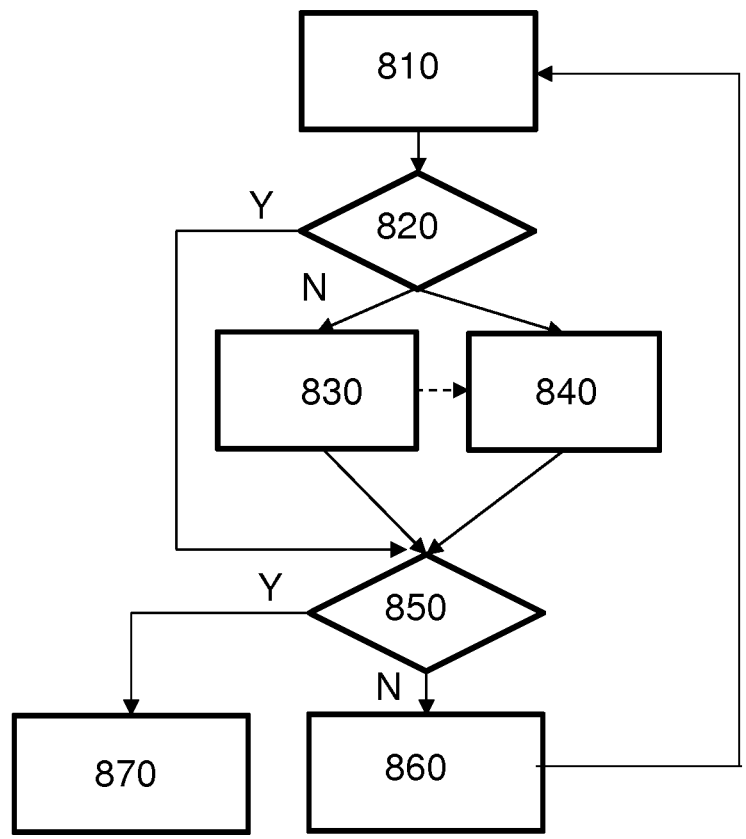
FIG. 8 schematically depicts a flow diagram of an embodiment of a method for patterning process error correction performed by a software application.

Referring to FIG. 8, a flow diagram of an embodiment of a method of patterning device error modification is shown. The method conducted in the flow diagram of FIG. 8 may be performed by a software application (e.g., the software application 330).

At 810, one or more values of a shape and/or of a patterning device patterning error of the patterning device are determined. For example, the software application may determine the shape of the patterning device based on reticle correction marks detected by a sensor of the patterning system. Additionally or alternatively, the software application may determine the shape of the patterning device based on measurements from a patterning device metrology system (e.g., measurement of registration error, measurement of one or more surface figures and/or measurement of focus data), desirably from points in the imaging field of the patterning device. In an embodiment, the shape is determined with, and without, a pellicle attached to the patterning device.

Additionally or alternatively, information related to a substrate patterning error of one or more substrates processed in the patterning system is determined or measured. For example, in an embodiment, the metrology apparatus 310 is configured to obtain measurements related to one or more substrates printed with patterns using the patterning device in the patterning system 300 and from which the substrate patterning error is determined. In an embodiment, additionally or alternatively, the substrate patterning error in the patterning system can be derived from measurements in the patterning system itself associated with one or more substrates, such as focus-related information derived from level sensor measurements (e.g., an intra-field focus problem, substrate unflatness, etc.), positional data of a substrate during exposure (e.g., from measurement system IF), etc. In an embodiment, the substrate patterning error is determined for one or more substrates processed using a patterning device modified and/or used in accordance with the first modification and/or second modification information as described below.

At 820, it is determined whether a difference between the determined parameter and a nominal value for the parameter is within a threshold range. For example, the software application 330 may evaluate whether one or more values of the shape and/or patterning device patterning error of the patterning device is within a tolerance range of an applicable nominal value. Additionally or alternatively, the software application 330 may evaluate whether one or more values of the substrate patterning error associated with the patterning device is within a tolerance range of an applicable nominal value. If the difference is within the tolerance range, the method proceeds to 850. Otherwise, the method proceeds to 830 or 840. As described above, in some examples, the nominal value is a desired value of the shape (e.g., an ideal shape such as a generally flat shape) and/or patterning device patterning error of the patterning device. In an embodiment, the nominal shape is a measured shape of the patterning device, e.g., the shape before application of a pellicle. In some examples, the nominal value is a matching shape and/or patterning device patterning error to enable patterning device to patterning device matching, such as the shape and/or patterning device patterning error of another patterning device or an average shape and/or patterning device patterning error of two or more patterning devices. In some examples, the nominal value may be a desired value of the substrate patterning error associated with the patterning device. In some examples, the nominal value may be a matching substrate patterning error to enable patterning device to patterning device matching, such as the substrate patterning error of another patterning device or an average substrate patterning error of two or more patterning devices.

At 830, first modification information is created based on the one or more values of the shape and/or patterning device patterning error of the patterning device. In an embodiment, the first modification is created to modify the shape of the patterning device toward an applicable nominal value associated with the shape, patterning device patterning error and/or substrate patterning error. The first modification information is used by the patterning device modification system to modify the shape of the patterning device by, in an embodiment, generating a plurality of local deformation elements and/or local transmission variations at appropriate positions in the patterning device according to the first modification information. This is done so that the difference between the determined shape, patterning device patterning error and/or substrate patterning error, and the nominal value therefor is within the threshold range. In an embodiment, creating the induced local deformation element and/or local transmission variation comprises creating the induced local deformation element and/or local transmission variation by using radiation to change a materials property of the substrate as described above with respect to FIG. 4A. For example, the first modification information may instruct the patterning device modification system to create a spatially distributed plurality of local deformation elements and/or local transmission variations above, below, or both above and below the central plane of the patterning device to bend at least a portion of the patterning device. In an embodiment, the spatially distributed one or more induced local deformation elements and/or local transmission variations transform a portion of a patterning device patterning error to a correctable error for the patterning system (e.g., the patterning system 300).

Additionally or alternatively, the first modification information is configured to adjust one or more modification apparatuses of the patterning system 300 so that the difference between the determined shape, patterning device patterning error and/or substrate patterning error, and the nominal value therefor is within the threshold range. For example, if the difference is entirely correctable by one or more modification apparatuses of the patterning system 300, then the first modification information may be exclusively modification information for one or more modification apparatuses of the patterning system 300. Or, if the difference comprises a component easily correctable by one or more modification apparatuses of the patterning system 300 and a component not so easily correctable, then the first modification information can comprise modification information for a patterning device modification 320 for the not easily correctable component and for one or more modification apparatuses of the patterning system 300 for the relatively easily correctable component.

At 840, second modification information is created based on the one or more values of the substrate patterning error associated with the patterning device. In an embodiment, the second modification is created to modify the shape of the patterning device toward an applicable nominal value associated with the substrate patterning error. The second modification information is used by the patterning device modification system to modify the shape of the patterning device by, in an embodiment, generating a plurality of local deformation elements and/or local transmission variations at appropriate positions in the patterning device according to the second modification information. This is done so that the difference between the determined shape and/or patterning device patterning error, and the nominal value therefor is within the threshold range. In an embodiment, creating the induced local deformation element and/or local transmission variation comprises creating the induced local deformation element and/or local transmission variation by using radiation to change a material property of the substrate as described above with respect to FIG. 4A. For example, the second modification information may instruct the patterning device modification system to create a spatially distributed plurality of local deformation elements and/or local transmission variations above, below, or both above and below the central plane of the patterning device to bend at least a portion of the patterning device. In an embodiment, the spatially distributed one or more induced local deformation elements and/or local transmission variations transform a portion of a patterning device patterning error to a correctable error for the patterning system (e.g., the patterning system 300).

Additionally or alternatively, the second modification information is configured to adjust one or more modification apparatuses of the patterning system 300 so that the difference between the determined substrate patterning error and the nominal value therefor is within the threshold range. For example, if the difference is entirely correctable by one or more modification apparatuses of the patterning system 300, then the first modification information may be exclusively modification information for one or more modification apparatuses of the patterning system 300. Or, if the difference comprises a component easily correctable by one or more modification apparatuses of the patterning system 300 and a component not so easily correctable, then the second modification information can comprise modification information for a patterning device modification 320 for the not easily correctable component and for one or more modification apparatuses of the patterning system 300 for the relatively easily correctable component.

In an embodiment, only the first modification information is created. In an embodiment, only the second modification information is created. In an embodiment, as shown by the dashed arrow, the first and second modification information is created. For example, in an embodiment, the second modification information transforms a portion of the substrate patterning error to a correctable error for the modification apparatus of the patterning system when the patterning device is modified according to the first modification information. In an embodiment, the first and second modification information is co-optimized.

In an embodiment, the patterning device modification system may modify the shape of the patterning device based on the first modification information and/or the second modification after the software application determines the first modification information and/or the second modification. Then the patterning system may generate patterns on a substrate using the modified patterning device. Substrate patterning error for printed patterns on the substrate using the modified patterning device may then be determined. The software application may then determine further modification information based on the substrate patterning error information for the modified patterning device.

In an embodiment, the substrate patterning error is differentiated from a shape error of the patterning device and/or a patterning device patterning error of the patterning device as described above. For example, in an embodiment, the substrate patterning error is processed such that it is substantially unrelated to such shape error of the patterning device and/or patterning device patterning error of the patterning device. Or, in another example, a qualification patterning device is used to determine the substrate patterning error that is substantially unrelated to the shape error of the patterning device and/or a patterning device patterning error of the patterning device.

At 850, optionally, it is determined whether, upon application of the first and/or second modification information, a parameter (e.g., shape, patterning device patterning error, substrate patterning error) associated with the patterning device is within a threshold range. If so, the method ends at 870. Otherwise, the method may proceed to 860.

In an embodiment, at 860, optionally, third modification information is created for one or more modification apparatuses of the patterning system 300 and is transmitted to the patterning system 300. In an embodiment, the third modification information enables correction of correctable error of the patterning process by the one or more modification apparatuses of the patterning system 300 upon adjustment, based upon the third modification information, of the patterning process by the one or more modification apparatuses of the patterning system 300 and use of a modified patterning device in the patterning system 300. That is, in an embodiment, one or more modification apparatuses of the patterning system 300 are configured to correct the correctable error produced by the patterning device modified based on the first and/or second modification information. In an embodiment, additionally or alternatively, the third modification information corrects residual patterning error remaining after modification of the patterning device based on the first and/or second modification information. In an embodiment, where first modification information is generated, the first and third modification information are co-optimized, or where second modification information is generated, the second and third modification information is co-optimized, or where both first and second modification is generated, the first, second and third modification is co-optimized.

The method may return to step 810. Such iterative modification of the patterning device and/or patterning system may continue until, for example, patterning error (e.g., overlay error, focus error, etc.) is within tolerance.

In an embodiment, the patterning device modification is made in increments. That is, modification information is produced that transforms non-correctable error to error that is correctable by the patterning system 300 by a first level of 100%, more than or equal to 98%, more than or equal to 95%, or more than or equal to 90% and/or that reduces error by a first level of 100%, more than or equal to 98%, more than or equal to 95%, more than or equal to 90%. Then, that modification information is reconfigured so that the modification information corrects to a second level less than the first level, e.g., 95% or less of the first level, 90% or less of the first level, or 85% or less of the first level. The patterning device is then modified according to the modification information for the second level so only part of the error is corrected. Then the modified patterning device is evaluated using a further simulation and/or measurement result in relation to the patterning system to arrive at a further modification at a third level to reduce the difference between the first and second levels. In this manner, for example, overcorrection may be avoided. For example, there may be long term drift in the patterning system and/or deltas between the set points of a modification apparatus of a patterning system and the actual performance of the modification apparatus that can be accounted for in the further correction(s) that may have not been properly accounted for in a first correction.

In an embodiment, the one or more modification apparatuses comprise adjuster AD, adjustment mechanism AM, positioning system PW, and/or a modification apparatus in the track. In an embodiment, the first, second and/or third modification information is created for a plurality of modification apparatuses of the patterning system, which together provide all or a portion of the correction.

In an embodiment, a fraction of the correction of the patterning error can be shifted between modification apparatuses of the patterning system or between patterning device modification and one or more modification apparatuses of the patterning system. For example, at least part of an error correctable by a modification apparatus of the patterning system can be shifted to be corrected by patterning device modification. For example, at least part of an error uncorrectable by a modification apparatus of the patterning system can be shifted to be corrected by patterning device modification and leave a remainder that is correctable. As another example, at least part of an error correctable by a particular modification apparatus can be shifted to be corrected by another modification apparatus (including via shifting at least part of the error to patterning device modification). As another example, at least part of an error uncorrectable by a modification apparatus can be transformed to be corrected by patterning device modification and/or by another modification apparatus. As an example, some correction of a particular k term of model (1) or (2) can be made by patterning device modification in order that another k term of model (1) or (2) can be corrected by a modification apparatus of the patterning system.

In an embodiment, the optimization aims for lowest intra-field residuals (e.g., lowest overlay error residuals) and/or lowest focus error residuals. In an embodiment, the optimization uses information specifying the range of spatial frequency correction available by modification of the patterning device using the patterning device modification system and/or the range of spatial frequency correction available by one or more modification apparatuses of the patterning system (e.g., the information may be specified for all modification apparatuses or for individual or groups of modification apparatuses). In an embodiment, the spatial frequency information is specified for different directions (e.g., x direction, y direction, etc.).

As discussed above, a patterning system may experience error and some of the error may not be correctable (typically due to the spatial resolution of the error) by one or more modification apparatuses of the patterning system. As described above, in an embodiment, the error that is not correctable by one or modification apparatus may be at least partially corrected by one or more other modification apparatuses (e.g., that has higher spatial resolution for error correction) and/or by a modification (e.g., a high spatial resolution correction) of a patterning device. To enable this error correction, measurement results may be used to determine the error (including, for example, its spatial distribution). The metrology apparatus 310 (e.g., metrology system MET) may enable such measurements and determine error information, such as overlay error, dose, focus, critical dimension, etc.

To make use of such measurements and to enable creation of the modification information, as discussed above, one or more mathematical models may be used. In an embodiment, the software application 330 enables the modeling and the use of the modeling to arrive at modification information.

In an embodiment, an error mathematical model is provided to model patterning error information (e.g., a fingerprint) of a patterning process using a patterning device in a patterning system. In an embodiment, the error mathematical model models patterning error information of substrates patterned in the patterning process using the patterning device in the patterning system. In an embodiment, the error mathematical model is tuned to one or more types of high resolution error. Examples of types of high resolution error include an error due to an etch-loading effect, an error due to projection system heating (e.g., from projection radiation), an error due to patterning device heating (e.g., from illumination radiation), an error due to substrate heating (e.g., from projected radiation), an error arising from illumination aberration sensitivity (e.g., of the projection system of a lithographic apparatus), an error in patterning system to patterning system matching (e.g., lithographic apparatus to lithographic apparatus matching), and/or an error in patterning device to patterning device matching.

In an embodiment, a correction mathematical model is provided to model a correction of the patterning error that can be made by one or more modification apparatuses of the patterning system and/or by a patterning device modification system (e.g., patterning device modification system 320, such as the tool described with respect to FIG. 4). In an embodiment, there is provided a correction mathematical model to model a correction of the patterning error that can be made by one or more modification apparatuses of the patterning system. In an embodiment, there is provided a correction mathematical model to model a correction of the patterning error that can be made by a patterning device modification system (e.g., patterning device modification system 320, such as the tool described with respect to FIG. 4A). In an embodiment, the correction mathematical model for the patterning device modification system has a higher resolution than the correction mathematical model for the one or more modifying apparatuses. In an embodiment, the error mathematical model has a resolution the same as or comparable to the correction mathematical model for the patterning device modification system. In an embodiment, high resolution comprises spatial frequencies on the substrate of 1 mm or less.

Thus, in an embodiment, modification information for one or more modifying apparatuses and/or a patterning device modification system can be obtained by applying one or more applicable correction mathematical models to the patterning error modeled by the error mathematical model.

In an embodiment, to parameterize the error mathematical model, the metrology apparatus 310 measures and determines patterning error information. In an embodiment, patterning error information comprises overlay error, focus, dose and/or critical dimension. To make the measurements, the metrology apparatus 310 may use one or more metrology targets (e.g., diffraction periodic structures, such as gratings, or structures of a device pattern itself) on substrates. Desirably, the one or more metrology targets accurately represent the patterning error and a sufficient amount and location of metrology targets are measured to properly characterize the patterning error across a substrate.

Accordingly, in an embodiment, the software application 330 is configured to identify one or more metrology targets for measurement and develop a metrology recipe for the one or more metrology targets. A metrology recipe is one or more parameters (and one or more associated values) associated with the metrology apparatus 310 itself used to measure the one or more metrology targets and/or the measurement process, such as one or more wavelengths of the measurement beam, one or more types of polarization of the measurement beam, one or more dose values of the measurement beam, one or more bandwidths of the measurement beam, one or more aperture settings of the inspection apparatus used with the measurement beam, the alignment marks used to locate the measurement beam on the target, the alignment scheme used, the sampling scheme, the layout of the metrology targets and the movement scheme to measure the targets and/or points of interest of a target, etc. In an embodiment, the metrology recipe is selected based on the error mathematical model.

In an embodiment, the one or more metrology targets may be designed and qualified for the patterning process. For example, a plurality of metrology target designs may be evaluated to identify the one or more metrology targets that minimize residual variation (systematic and/or random). In an embodiment, a plurality of metrology target designs may be evaluated to identify the one or more metrology targets whose performance match the device, e.g., identify a metrology target whose measure of overlay error matches the overlay error of the device. The metrology target may be designed, e.g., for measurement of overlay, of focus, of critical dimension (CD), of alignment, of asymmetry in the target, etc. or any combination selected therefrom.

In an embodiment, the metrology apparatus 310 may apply one or more sampling schemes for a metrology process. In an embodiment, a sampling scheme may include one or more parameters selected from: number of sample points per substrate, number of substrates per lot sampled; numeric designation of the substrate(s) in a lot or per lot sampled; number of fields sampled; layout/locations of sampled fields on the substrate; number of sites in each field; locations of the sites in the field; frequency of samples; type of metrology target; or measurement algorithm.

In an embodiment, where a new or modified device pattern (and thus new measurement data) is used for an otherwise same patterning process and same layer, then one or more previously determined models (but parameterized for the new measurement data) and sampling schemes may be used; thus, it may not be necessary to newly determine one or more mathematical models or newly determine one or more sampling schemes.

While the discussion above has focused mostly on modifying a shape or profile of a patterning device to compensate for patterning error, the patterning device can additionally or alternatively be modified to make corrections that do not modify the shape or profile of the patterning device. For example, one or local transmission variations and/or local deformation elements can be applied, e.g., at or near a center of the patterning device to make a correction of patterning error in addition to or alternatively to changing a shape or profile of the patterning device (which would compensate for a patterning error).

In particular, as further discussed below, a modification can be made to a patterning device to compensate for a focus offset induced by a topography of a substrate exposed using the modified patterning device. In particular, one or more local transmission variations (which affects the dose or exposure of the substrate) can be made to compensate for such topography induced focus offset.

In a typical processing of a substrate, one or more overlaying layers of device structures are formed on a substrate. So, in an embodiment, a first layer can be formed by patterning a resist, which is then used as a mask for etching of layer. Then, one or more materials may be deposited thereon. For example, one or more filling materials may be provided to "fill" up any remaining recess. Thereafter, prior to application of a further layer of resist to pattern a next layer, a planarization process (e.g., chemical mechanical polishing (CMP)) may be performed to smooth the layer of the substrate for application of the resist layer. The smoothing is provided so that the subsequent resist layer is desirably smooth.

However, a topography can exist in a layer of the substrate underlying the resist layer, whether there has been a planarization process of that layer or not. The topography can be introduced by local pattern density variations over multiple layers on the substrate, even where a planarization process has been used on one or more of these layers. Therefore, the combined effect of pattern density and planarization on layers 0 to N−1 therefore form the topography that is encountered during the exposure of layer N.

Thus, the topography can induce, in particular, an intra-die or intra-field effect since it arises from pattern density variations at the die or field level (hereinafter the discussion will focus on the die level but the same considerations apply at the field level)—in an embodiment, a die corresponds to a portion of an object that becomes an individual device. That is, where the object is a semiconductor wafer, the object is cut into pieces corresponding to the dies, each die becoming, e.g., a semiconductor device; while, in an embodiment, a field corresponds to the size of the exposure field of a lithographic apparatus used to pattern a substrate and so a field may comprise a plurality of dies, where, e.g., the patterning device provides a pattern comprising a plurality of dies). This topography effect is distinct from an inter-die variation across the substrate (e.g., arising from substrate warping, etc.). Moreover, this intra-die topography effect is highly systematic, relatively predictable, and on a spatial frequency of the one or more functional blocks of device design. This is because essentially the same combination of pattern density variations occurs in each die across a substrate for a particular patterning process to manufacture a particular device on substrates.

Focus and dose control can be enabled at an intra-field level within the lithographic apparatus itself. For example, optical aberrations of the projection system of the lithographic apparatus can be controlled using, for example, one or more actuators that can induce a desired deformation in an optical element to impart a focus correction (e.g., a Zernike Z4 modification). As another example, dose corrections can be made in a direction parallel to the scan direction or in a direction perpendicular to the scan direction (e.g., a variable-profile gray filter inserted in the radiation path).

However, the spatial resolution of focus offset due to topography is well below the exposure field size of a lithographic apparatus. The focus and dose corrections described above operate at the exposure field level and the corrections have a spatial resolution at the field size level (e.g., corrections with a spatial resolution in the millimeters). In contrast, the stack topography can induce focus offsets at a spatial resolution (e.g., errors up to tens of microns) well below this spatial resolution. So focus correction using the lithographic apparatus may not be effective. Correcting for these high spatial frequency topography induced focus offsets by a dose cross-correction using the lithographic apparatus is also not feasible. Dose corrections applied using the variable-profile gray filter are on a much lower spatial frequency. Therefore, topography induced focus offsets may not be corrected using on one or more correction devices of the lithographic apparatus alone.

But, as noted above, it has been recognized that the focus offset due to topography is very repeatable for a layer (e.g., essentially the same for each die/field/substrate). Thus, a fixed compensation can be applied at the die/field level for each exposure of the resist layer overlaying that layer. Moreover, a particular patterning device will be used to pattern the resist layer overlaying that layer.

Accordingly, it is proposed to compensate for the topography induced focus offset by modifying the patterning device at the die/field level. This modification is made at the spatial frequency/resolution of the topography induced focus offsets.

In an embodiment, the compensation for the topography induced focus offset is done by providing one or more local transmission variations (as described above) in the patterning device at a spatial frequency/resolution comparable to that of the substrate topography induced focus offset, that cause a local dose change that can compensate for the substrate topography induced focus offset at the spatial frequency/resolution of the substrate topography induced focus offset. That is, the local transmission variations at the patterning device are used to induce a local dose change during exposure. This dose change can cross-correct the topography induced focus offset as described in more detail below.

The local transmission variation on the patterning device can implement a dose correction on a 0.5 mm or less, 0.25 mm or less or 0.1 mm or less, resolution level at the substrate. This resolution maps quite well to functional blocks within device designs that have a common topography height variation.

In addition to providing local transmission variations, other modifications can be made to the patterning device. For example, one or more local height steps can be provided in the patterning device to induce a focus change at the substrate level. For example, a transparent mask blank can be etched or otherwise modified to introduce height steps in regions between opaque portions (e.g., chrome portions). So, in an embodiment, one or more functional areas of the device pattern can have its own associated height on the mask blank before the device pattern features are printed on the reticle (e.g., by selective removal of a chrome layer provided over the mask blank). The height variation enables direct focus compensation. Further, similar adjustments can be made for different phase regions of, e.g., a phase shift mask.

Additionally or alternatively to height steps in a patterning device, one or more optical proximity corrections can be applied to the device pattern for application to the patterning device. For example, an absorber (e.g., chrome) width bias, an assist feature, an absorber thickness change, etc. can be introduced. In an embodiment, the optical proximity corrections would be targeted at best energy/dose shift and/or best focus shift.

As alluded to above, a dose correction can be used to cross-correct a topography induced focus offset. How this is enabled is described in relation to a process window for exposing a pattern.

A process window and process window data may be used to determine a compensation for the topography induced focus offset. From a mathematical point of view, a process window is a region in a vector space spanned by all the process parameters of a patterning process. In a given patterning process, the process window of a pattern is dictated only by the specifications of the pattern and the physics and/or chemistry involved in the patterning process. Namely, if the specifications and the physics/chemistry do not change during the patterning process, the process window does not change.

So, to aid in evaluation and/or change of the patterning process, it can be useful to consider a process window in terms of a plurality of the process parameters (i.e., a space of the processing parameters under which a pattern will be produced within specification). For example, a process window (and associated process window data) can be defined as a set of focus and dose values for which a resist image is within a certain limit of the design specification of the resist image. But, the process window and process window data may be extended to a generalized process window definition that can be established by different or additional base parameters in addition to, or alternatively to, exposure dose and focus. These may include, but are not limited to, optical settings such as NA, sigma of the illumination, optical aberration, polarization, and/or optical constants of the resist layer. Examples of pattern specifications that relate to potential systematic defects include checks for necking, line pull back, line thinning, critical dimension (CD), edge placement, overlapping, resist top loss, resist undercut and/or bridging.

Further, various patterns for exposure using a patterning device may have different process windows. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. In an embodiment, when controlling or changing a patterning process, it is possible and economical to focus on the hot spots; when the hot spots are not defective, it is most likely that the all the patterns are not defective. However, in an embodiment, other patterns may be considered to determine process window data.

Figure 9B:
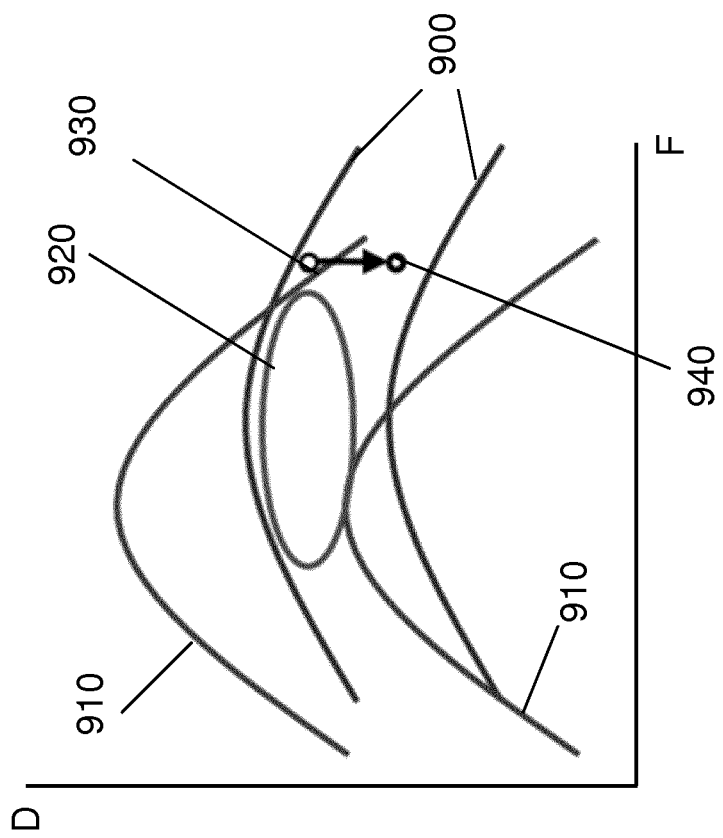
FIGS. 9A and 9B highly schematically depict process window boundaries/contour plot for a number of features of a patterning device pattern.
Figure 9A:
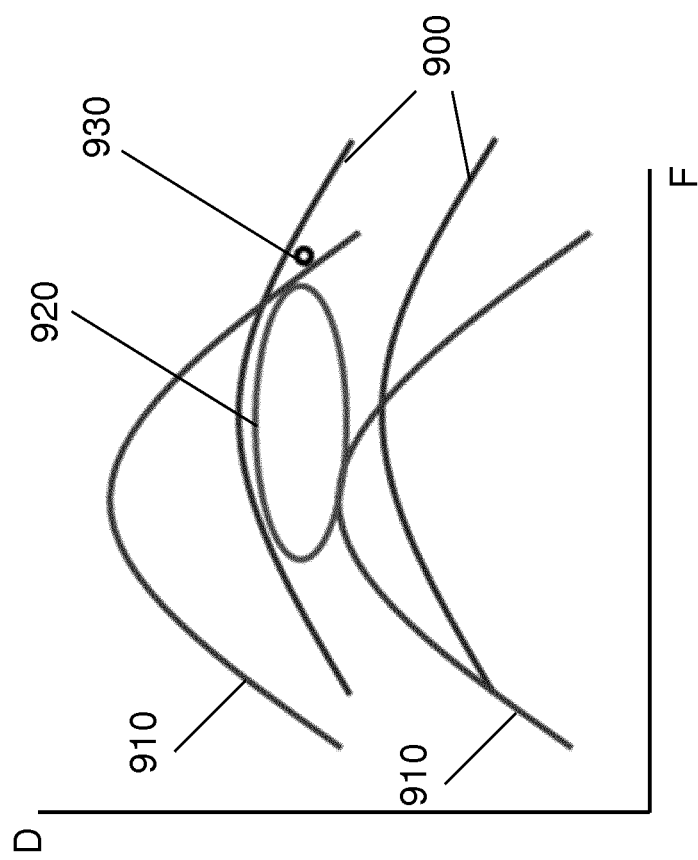

Referring to FIGS. 9A and 9B, example graphs to represent a process window are depicted. FIGS. 9A and 9B depict highly schematic process window boundaries/contour plot of overlapping process windows of various pattern features of a device pattern. In this example, the horizontal axis is focus and the vertical axis is dose. The curves correspond to a particular critical dimension. For example, curves 910 depict process window boundaries for a particular maximum acceptable CD larger than a nominal CD for a particular pattern feature and a particular minimum acceptable CD lower than the nominal CD. Thus, the space between the curves defines a process window for that pattern features. Similarly, curves 920 depict process window boundaries for a particular maximum acceptable CD larger than a nominal CD for another particular pattern feature and a particular minimum acceptable CD lower than the nominal CD for that other pattern feature. So, ellipse 920 represents a generalized process window for numerous pattern features (more than those depicted) of the pattern. It can be further seen that the curves 910 and 920 can also be characterized as hot spots since they generally define at least part of the boundary of process window 920.

Now, FIGS. 9A and 9B further show how the principle of compensating a topography induced focus offset with dose can be implemented. Before compensation, feature 930 exposed on a layer with a focus offset arising out of topography is out of specification by being outside of the upper curve 910. Further, feature 930 is also close to being outside of specification in relation to the upper curve 900 (and so any further focus variation (e.g., additional topography induced focus offset) could cause feature 930 to be out of specification of curves 900).

So, by inducing a dose variation as shown in FIG. 9B, the feature 930 can be "moved" to be located at point 940. In this case, there would be a dose reduction that can be induced by local transmission variation of the patterning device. So, point 940 is within the process window defined by curves 910 and further would be farther from the process window defined by curves 900 in terms of focus variation.

Of course, this is possible if the focus offset is known before exposure. In this case, because topography is systematic and therefore predictable, dose correction to compensate for a topography induced focus offset is feasible.

Figure 10:
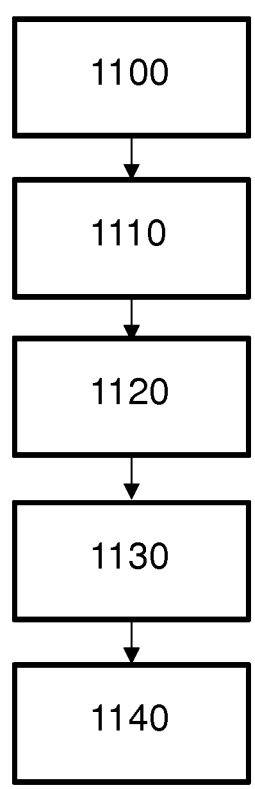
FIG. 10 schematically depicts a flow diagram of an embodiment of a method for patterning process error correction performed by a software application.

FIG. 10 schematically depicts a flow diagram of an embodiment of a method for patterning process error correction performed by a software application. At 1100, an expected substrate topography is determined for a particular layer (e.g., a layer underlying a resist layer and the consequent expected topography on a resist layer over the layer, or of the resist layer).

The topography can be determined in various ways. For example, a metrology tool can be used to measure the topography of the particular layer of one or more fields/die of one or more substrates processed using the patterning process. For example, a scanning electron microscope or other metrology device can produce a representation of the topography. In an embodiment, the topography can be an average topography measured across a plurality of dies from one or more substrates. The topography of the resist layer can then be expected to be substantially the same as the topography of the measured particular layer.

In an embodiment, referring to FIGS. 11A-11D, a technique of determining topography is depicted. In this embodiment, the topography can be obtained by using a sensor that directs electromagnetic radiation at the substrate and a sensor to detect the radiation redirected by the surface of the substrate. An example of such a sensor is a level sensor. In an embodiment, the sensor is part of the lithography apparatus. In an embodiment, the measured layer is a resist layer overlying one or more device structures (that have been subject to a planarization or not). The radiation measurements are configured to be indicative of the topography. However, the topography data may not be at a spatial resolution/frequency of the topography. For example, the beam spot may be on the order of tens or hundreds of microns, while the height variations may be of the order of microns. An example of such data is shown in FIG. 11A. It can be seen, by virtue of the varying shades, that there is a topography and that it conforms to one or more device structures previously formed, but it is not very well resolved. Accordingly, in an embodiment, as shown at FIG. 11B, a representation of the one or more patterns corresponding to the one or more device structures previously formed in one or more layers at the region is obtained. This representation is used to perform a guided fit of the data of FIG. 11A to yield a higher resolved representation of the topography at FIG. 11C (e.g. deconvolution algorithm using data regarding the pattern layout). Then, a reconstruction is performed on the data of FIG. 11C using the representation of FIG. 11B to arrive at a reconstructed profile in the plane of the topography substantially conforming with the representation of FIG. 11B in combination with the height data extracted from the data of FIG. 11C. It can be seen in FIG. 11D that a number of the different regions of different topography height corresponds to device structures. Moreover, it can be seen that those structures are fairly discrete shapes that take up fairly significant areas. Thus, while the spatial resolution/frequency is small, the spatial resolution/frequency is large enough that a local transmission variation of the patterning device can be used effectively. An embodiment of determining the topography is described in U.S. Patent Application No. 62/367,023, which is incorporated herein in its entirety by reference.

In an embodiment, the topography can be predicted based on the device design. As seen above, despite a planarization, the topography substantially conforms in shape and profile to the device structure formed in the one or more layers. So, knowing the typical topography of device features for the particular layer under consideration (e.g., knowing the typical topography of a feature subject to a certain planarization), the topography at the particular layer can be calculated. This may be particularly the case for a highly regular pattern. In an embodiment, the prediction can employ information of previous layers below the particular layer to arrive at the prediction for the particular layer. In an embodiment, a planarization model can be used to predict the effects of planarization on the particular layer (and optionally on other layers below the particular layer).

So, having the topography from 1100, an expected focus offset for one or more particular regions of the substrate surface is determined at 1110. In an embodiment, the particular region is a region having a size corresponding to the spatial resolution of the modification (e.g. local transmission variation) of the patterning device by the patterning device modification apparatus. In an embodiment, the particular region corresponds to a functional area of the device structure of the substrate expected to have a substantially common topography height or to have a topography height having a certain range (e.g., within 15%, within 10%, or within 5% of a certain topography height). In an embodiment, the region can be identified by image analysis of the topography, e.g., to identify regions of substantially common topography height or to have a topography height having a certain range. In an embodiment, the region can be identified by analysis of the device design (e.g., a GDSII file can identify a functional area expected to have a substantially common topography height). In an embodiment, an expected focus offset for the particular region of the substrate topography corresponds to the variation of the topography from a plane of best focus defined with respect to the topography. The plane of best focus can be above the topography, below the topography or somewhere intermediary the top and bottom of the topography.

At 1120, a modification of the patterning device is determined directly or indirectly based on the focus offset. In an embodiment, to enable determination of the modification, a desired target dose (e.g., best energy) is determined for each of the one or more particular regions, e.g., one or more functional areas of the device at the particular layer, that can compensate for a particular focus offset at each of the one or more particular regions. A local transmission variation is determined based on the determined target dose or on a dose offset between the determined target dose and a nominal dose for the entire patterning device pattern or for a part of the patterning device having the pertinent one or more particular regions.

The desired target dose can be determined computationally using one or more patterning process mathematical models. For example, one or more models can simulate the exposure of the patterning device pattern onto a substrate having the determined one or more particular regions of topography. With those results, it can be evaluated whether one or more suspect features of the exposed pattern in a particular region will not be, or will be close to not being, able to print without a defect (e.g., it can be analyzed in a similar fashion as described above with respect to FIG. 9 in relation to a process window). Typically, the amount of features is limited per particular region (e.g., a functional area) and so this analysis should have a limited computation time. Further, a dose can be computed for the one or more suspect features to effectively shift their location in the process window so that the one or more suspect features in the particular region can be printed effectively in the face of the topography induced focus offset of the particular region in which they are located.

The local transmission variation created for the computed dose can have an effect on one or more other features of the pattern in the proximity of the one or more suspect features and within the region of the local transmission variation. Accordingly, the simulations can be performed to account for the computed dose/local transmission variation in relation to other features to help ensure that additional or alternative hot spots are not produced by the local transmission variation. Should there potentially be additional or alternative hot spots created, an optimization process can be used to help determine a computed dose/local transmission variation that maximize compensation of the focus offset for the features in the particular region.

In an embodiment, the modification can include one or more modifications in addition to a local transmission variation. Accordingly, the further modification (e.g., an optical proximity correction, a patterning device height difference, etc.) can be computed directly or indirectly based on the focus offset. For example, the appropriate patterning device height can be calculated directly from the focus offset using, e.g., an appropriate correction for magnification. In an embodiment, a pattern shift (at the patterning device or at the substrate) due to the focus offset can be calculated based on the topography height using an appropriate conversion, e.g., focus offset conversion dF*topography height T at the applicable x,y location in the plane of the particular region, wherein the focus offset conversion (which can include a function) converts the focus offset to a pattern shift which can be linear or non-linear). If the pattern shift is at the substrate, the pattern shift can be converted to an appropriate optical proximity correction (e.g., a bias, an assist feature. etc.).

At 1130, the local transmission variation is applied to the patterning device so that the modified patterning device can be used at 1140 to expose its pattern so as to mitigate an impact of the substrate topography on a parameter (e.g., CD of the exposed pattern) of the patterning process.

While the discussion above has focused on local transmission variations to compensate for topography induced offset, the same concept can be applied to modify a reflection of, e.g., a reflective patterning device (such as a reflective EUV mask).

Thus, in an embodiment, a focus offset induced by substrate topography is mitigated by a dose correction implemented by a local transmission variation made in a patterning device using a patterning device modification apparatus. The focus offset induced by substrate topography can be anticipated because the topography is typically repeatable, and substantially the same, across the substrate. Moreover, focus offset induced by substrate topography has a typically higher spatial frequency/resolution than a lithographic apparatus correction apparatus and so the high spatial resolution dose correction capability of a patterning modification can be used to correct a focus offset that may not be fully corrected by a lithography apparatus and that is systematic per die/field. As a result, a compensation for the defocus induced CD, overlay, etc. error is achieved by a dose correction using topography estimates/measurements to alter a local patterning device transmission.

Further, various techniques described in association with shape or profile modification can be used with the techniques to correct for a focus offset induced by substrate topography. As applicable, those techniques can be used in addition to the techniques to correct for a focus offset induced by substrate topography or as a substitute for one of parts of the techniques to correct for a focus offset induced by substrate topography. As an example, the techniques to co-optimize the correction with one or more modification apparatuses made by one or more patterning process apparatuses (e.g., the lithographic apparatus) can be used with the techniques to correct for a focus offset induced by substrate topography.

In order to design, monitor, control, etc. the patterning process (e.g., a device manufacturing process) that includes at least one patterning step (e.g., an optical lithography step), a patterned substrate can be inspected and one or more parameters of the patterned substrate are measured. The one or more parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on a substrate. There are various techniques for making measurements of the structures formed in the patterning process, including the use of a scanning electron microscope, image-based measurement or inspection tools and/or various specialized tools. A relatively fast and non-invasive form of specialized metrology and/or inspection tool is one in which a beam of radiation is directed onto a target on the surface of the substrate and properties of the scattered (diffracted/reflected) beam are measured. By comparing one or more properties of the beam before and after it has been scattered by the substrate, one or more properties of the substrate can be determined. This may be termed diffraction-based metrology or inspection. Details of embodiments of such metrology are described below in respect of FIGS. 16-19.

To provide the metrology target on the substrate, a patterning device has a pattern to create the metrology target on the substrate. So, in an embodiment, it would be desirable to provide a pattern to the patterning device to enable determination of a value of a parameter (such as focus and/or dose) of a patterning process by measuring the metrology target created on a substrate using the pattern of the patterning device.

In an embodiment, to enable this, there is provided a metrology feature to a patterning device that produces a metrology target on the substrate that has a dimension (e.g., CD) that is sensitive to focus. One way to do this for focus is to add sub-resolution features in a patterning device pattern at side of a feature of the patterning device pattern that is intended to be resolved, which causes a side wall angle of the resolved feature in the resist to become focus sensitive. Then, after calibration, a determined side wall angle can be used to determine focus and then used for, e.g., product focus control. In an embodiment, such a target can be provided with a product pattern (e.g., among the device product pattern features or in a scribe lane area) to enable on product focus control. However, structures containing sub-resolution features are not always compliant with design rules and so can be rejected when added to the patterning device. Further, when printed, such targets could cause defects. Additionally or alternatively, resist parts from such printed targets can contaminate other parts of the substrate.

So, in an embodiment, there is provided a patterning device having target features having different respective distances to the substrate. That is, in an embodiment, one feature at an exterior surface of the patterning device has a different height in, e.g., the z direction relative to another feature at the exterior surface of the patterning device. By having one feature at a different height than the other feature, there can be provided a positive and/or negative focus offset. This results in a relative change in the dimension of the printed metrology features and which relative change can then be translated into whether there is an error in focus (or not).

Figure 12:
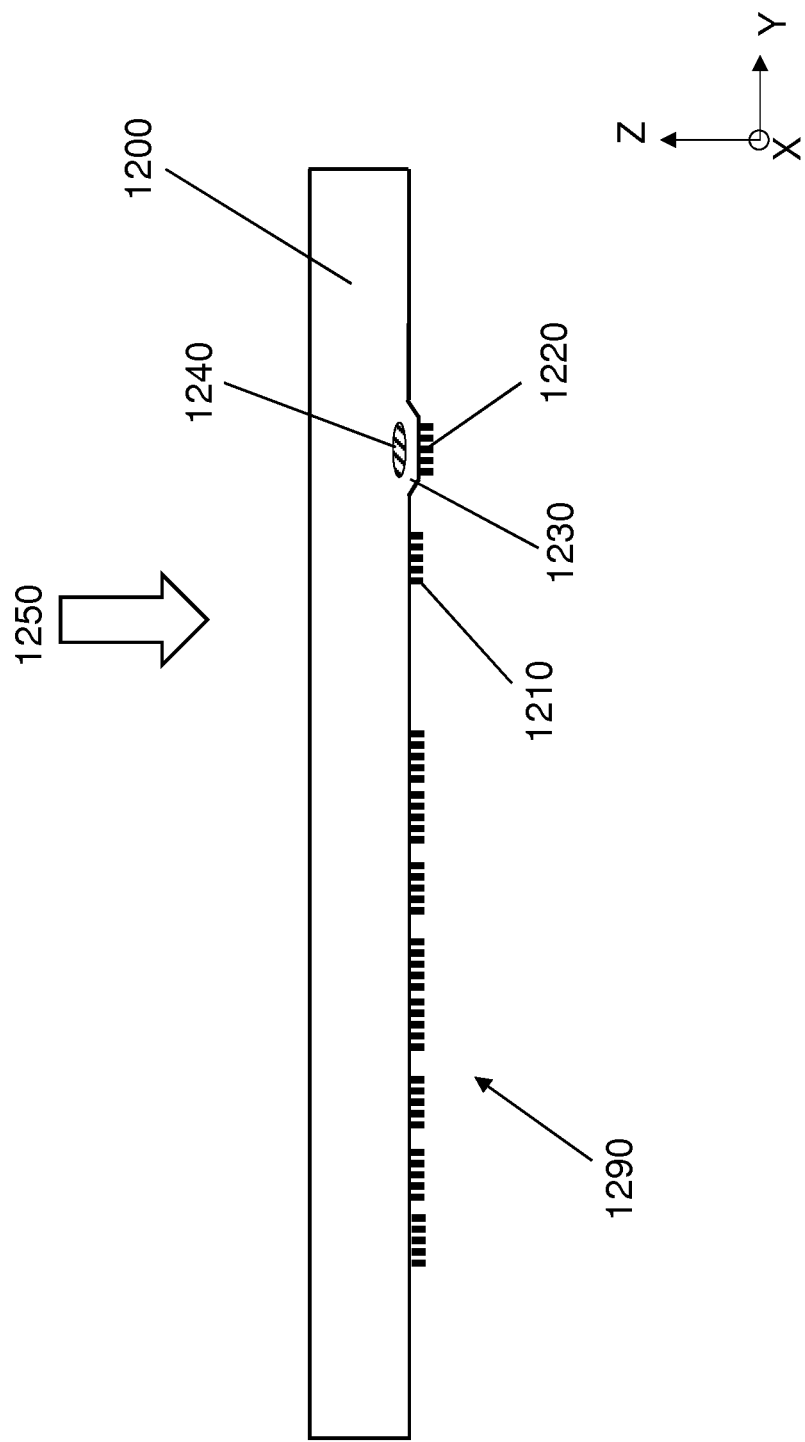
FIG. 12 schematically depicts an example of a patterning device modified to have a topographical variation in an external surface and having a metrology target pattern at the variation.

Referring to FIG. 12, an example patterning device 1200 is depicted having a plurality of metrology target features 1210, 1220. In an embodiment, each of the metrology target features 1210, 1220 comprises a periodic structure (e.g., a grating). As will be appreciated, the metrology target features 1210, 1220 act to pattern the illumination radiation 1250, which patterned illumination radiation exposes a radiation-sensitive substrate to form metrology targets at the substrate. While FIG. 12 shows a transmissive patterning device 1200 for, e.g., DUV applications, the patterning device 1200 can be reflective for, e.g., EUV applications.

In an embodiment, the metrology target features 1210, 1220 are the same basic structure, e.g., a grating with a same pitch and feature size. However, in an embodiment, metrology target feature 1210 can be different in structure from metrology target feature 1220.

As seen in this example, metrology target feature 1220 is located on a protrusion 1230 so as to provide feature 1210 at an exterior surface of the patterning device 1200 having a different height in, e.g., the z direction relative to feature 1220 at the exterior surface of the patterning device. Further, while feature 1210 is not shown on a protrusion, it can also be located on a protrusion (or be located at an indent as described below). And, while in FIG. 12, feature 1220 is shown located on a protrusion, in an embodiment, feature 1220 can be located on an indent of the exterior surface. Moreover, feature 1210 can be located at an indent as well or located at a protrusion. Thus, feature 1210, 1220 can be located any combination of flat surface, protrusion and/or indent such that feature 1210 has a different height in, e.g., the z direction relative to feature 1220. So, there is the possibility to add a positive and/or negative focus offset at the patterning device level (although having an offset in one direction would be sufficient).

While two features 1210, 1220 are depicted, in an embodiment, more than two features 1210, 1220 can be provided. For example, in an embodiment, a positive focus offset can be provided by a first combination of features and a negative focus offset can be provided by a second different combination of features (which second combination can share a feature with the first combination).

In an embodiment, the patterning device can have a device pattern 1290. Thus, the features 1210, 1220 can be created with the formation of the device pattern 1290 on a substrate. By creating the metrology targets on the substrate along with a device pattern on the substrate created using the device pattern 1290, the metrology targets can accurately reflect the focus used to create the device pattern 1290 since the metrology targets on the substrate will have been created with the substantially same optical conditions (e.g., a same relative positioning between the substrate and the patterning device for focus) as those used to create the device pattern on the substrate.

In an embodiment, the height difference should be sufficient to create a measurable focus offset at the substrate level taking into account the lateral (de)magnification 'Mag' of the projection system. As an approximation a height difference 'dFp' on the patterning device is linearly translated to a focus offset 'dFs' at the substrate using the following formula: dFs=dFp*Mag^2. Most lithographic apparatus have a lateral magnification of ¼, hence typically dFs~dFp/16, although for higher NA systems this may deviate (dFs~dFp/12 for example). In an embodiment, the height difference is selected from the range of 80 nm-500 nm, selected from the range of 120 nm-400 nm, or selected from the range of 140 nm-350 nm. In an embodiment, the focus offset at substrate level is selected from the range of 5 nm-40 nm, selected from the range of 8 nm-30 nm, or selected from the range of 10 nm-20 nm.

In an embodiment, a shape (e.g., in the Z-position) of a patterning device substrate surface is modified to provide at least one metrology target feature at a different focus position than another metrology target feature so as to create a focus offset between at least two metrology target features. In an embodiment, the protrusion 1230 (or an indent) is created by inducing one or more local deformation elements 1240 as discussed herein. So, in an embodiment, modification information is created to cause a patterning device modification apparatus to provide one or more local deformation elements 1240 to cause the exterior surface of the substrate to have a modified shape so as to have feature 1210 at a different height in, e.g., the z direction relative to feature 1220. In an embodiment, the one or more local deformation elements are provided when a feature 1210, 1220 is already located on the patterning device. The one or more local deformation elements 1240 can create a protrusion or an indent. In an embodiment, a layer of local deformation elements can provide an offset at the patterning device in the range of 40 nm-60 nm. So, in an embodiment, for an about 120 nm to 200 nm offset at the patterning device, 3 or 4 layers of deformation elements can be used to provide a focus offset at the substrate of about 8 to 12 nm.

By having a focus offset between the metrology target features, a shift in focus will manifest as a change in a physical characteristic of at least one of the metrology features, which change in physical characteristic can be measured in terms of, e.g., measured CD of the metrology target features at the substrate, or measured reflectivity of the metrology target features at the substrate, etc. That is, in an embodiment, when the metrology target features are printed on the substrate, they will show a relative shift of their associated Bossung curves, which allows for, e.g., determination of a focus position of the substrate with respect to a focal plane of the projection system used to image the patterning device to the substrate. For example, by having enough focus offset between the metrology target features, at least one of the metrology target features will be sufficiently from its best focus at most, if not all, values of focus such that a physical characteristic of that metrology target feature as printed on the substrate will vary from its expected physical characteristic (e.g., a width of a grating line can become wider than its expected width and thus measured as a change in CD).

So, in an embodiment, first and second metrology target features having the focus offset at the patterning device are printed on the substrate using illumination and at a substantially same optical condition, i.e., at least a same focus setting. The printed first and second metrology target features are then measured to determine a value of a characteristic thereof (e.g., CD, reflectivity, etc.) for each of the printed first and second metrology target features. A difference in the values of the characteristic is then obtained and provides a signal of focus error. In an embodiment, the difference can be evaluated to determine a variation in focus from a certain nominal focus (e.g., the best focus) by, for example, reference to a correlation between the difference and the variation in focus or a calibration of the difference to a certain nominal focus. For example, if symmetrical focus behavior is assumed over a small focus range, then a difference of zero can correspond to zero focus error and so a non-zero difference represents a focus error. Where more than two metrology target features are provided, the results of the values of the characteristic can be combined in various ways to produce a signal of the focus error. For example, a set of characteristic values can be differenced and another set of characteristic values can be differenced and then the two differences averaged. As will be appreciated, many different combinations are possible to arrive at a signal of the focus error.

The difference, the determined variation in focus or some other derived value therefrom can then be used in various applications. One such application is monitoring of focus to identify, for example, if a defocus has met or exceeded a threshold. An additional or alternative such application is control of the patterning process (e.g., causing a change in a setting of a lithographic apparatus to change the focus).

In an embodiment, the focus offset between first and second metrology target features and a correlation between the difference in the measured characteristic of the printed first and second metrology target features and the variation in focus can be calibrated via a focus exposure matrix type process. For example, in the focus exposure matrix process, a potential set of first and second metrology target features can be printed at various different known defocus values and then measured to determine whether the difference between the values of a characteristic (e.g., CD, reflectivity, etc.) for the printed first and second metrology target features varies with the defocus changes and well enough at the expected focus and expected variation thereof. If there isn't a sufficient response, the offset can be varied and a new set of first and second metrology target features created and tested. Further, with expected set of first and second metrology target features, the expected set of first and second metrology target features can be printed at various different known defocus values and then measured to determine the difference between the values of a characteristic (e.g., CD, reflectivity, etc.) for the printed first and second metrology target features. Those measured values of the difference can then be correlated with the known defocus values to create the correlation between the difference in the measured characteristic of the printed first and second metrology target features and the variation in focus or to calibrate the difference to a certain nominal focus.

Figure 13:
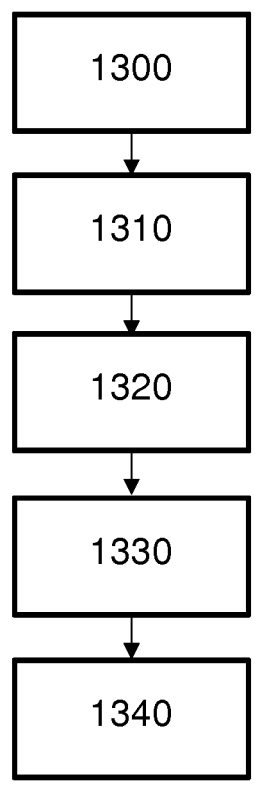
FIG. 13 schematically depicts a flow diagram of an embodiment of a method for patterning process parameter determination.

So, referring to FIG. 13, an example process of creating and using a set of first and second metrology target features for focus is depicted. At 1300, a set of first and second metrology target features are selected including determining their height offset at the patterning device. A focus exposure matrix type process as described above can be used in selection of the set of first and second metrology target features. In an embodiment, a focus exposure matrix type process as described above can be used to derive a correlation between the difference in measured characteristics of the printed first and second metrology target features and variation in focus or a calibration of the difference to a certain nominal focus. As noted above, there can be more than two metrology target features.

At 1310, modification information is created to modify the patterning device to physically create the height offset between the first and second metrology target features for the production patterning device, i.e., the patterning device used for control, monitoring, etc. of the patterning process (and which patterning device may have a device product pattern). The modification information is then used by a patterning device modification apparatus as described above to create one or more local deformation elements to provide the height offset. The modification of the patterning device can be done before the patterning device is provided with the first and/or second metrology target feature or after the first and/or second metrology target feature is provided to the patterning device. In an embodiment, the first and second metrology target feature can be provided on a patterning device having a device product pattern.

At 1320, the set of first and second metrology target features are exposed on a substrate and then measured using, for example, a metrology apparatus such as depicted and described with respect to FIGS. 16-19 to obtain a value of a characteristic (e.g., CD, reflectivity, etc.) for each of the printed first and second metrology target features. As noted above, the characteristic varies with change of a physical characteristic of the printed first and second metrology target features due to focus change.

At 1330, a difference between the values of the characteristic (e.g., CD, reflectivity, etc.) for the printed first and second metrology target features is obtained from the measured characteristics. In an embodiment, the difference involves a subtraction. In an embodiment, the difference involves a different mathematical operation.

At 1340, the difference, a focus value corresponding to the difference (obtained using, e.g., the correlation described above) or some other derived parameter is used in an application. For example, in a monitoring application, the difference or the focus value can be compared to a threshold to determine whether a focus variation is out of specification. For example, a non-zero value of the difference can indicate a focus error. As another example, in a control application, the difference, the focus value or some other derived parameter can be used in control of an aspect of the patterning process (e.g., changing a setting of a lithographic apparatus) by, e.g., comparison against a threshold.

So, in an embodiment, there is provided a difference in focus position between a first and a second metrology target feature using a local adaptation of a patterning device surface (i.e., a protrusion and/or indent). In an embodiment, that local adaptation is created by a local deformation element (e.g., change in patterning device substrate density) provided to an interior of the patterning device substrate. Then, metrology applied to the metrology target features as exposed on the substrate is used to arrive at measured values of a characteristic, which values are used to signal or determine a local focus error.

In an embodiment then, there is provided a technique to determine lithographic apparatus focus, desirably from targets on a substrate having device patterns (e.g., to enable increased throughput and efficiency by not having to use a separate patterning device or use one or more send-ahead substrates that are not used to produce devices, to enable more accurate focus determination, etc.) made using a patterning device having the device pattern and the metrology target features to create the targets. Through use of such metrology target features, better focus control can be achieved and hence desirably realize higher yield, less rework in case of changes in the applied corrections, etc. Furthermore, in an embodiment, there is provided a self-calibrated solution (e.g., when using reflectivity differences) that may not require sometimes time-consuming target reconstruction.

In addition or alternatively to the techniques to determine focus as described above, there is provided a dose determination technique (for, e.g., patterning process control, monitoring, etc.).

In an embodiment, to enable this, there is provided a metrology feature to a patterning device that produces a metrology target on the substrate that has a dimension (e.g., CD) that is sensitive to dose (exposure). In particular, in an embodiment, there is provided a patterning device having target features that provide different respective doses toward the substrate. That is, in an embodiment, the patterning device is constructed such that a different amount of dose is provided to and/or provided from one metrology target feature compared to another metrology target feature. Thus, there can be provided a dose offset between the metrology target features. In an embodiment, this is accomplished by a variation in an optical path for one metrology target feature compared to another metrology target feature such that a different dose is provided to the substrate for the one metrology target feature compared to the other metrology target feature. This results in a relative change in the dimension of printed metrology features and which can then be translated into whether there is an error in dose (or not). So, in an embodiment, a CD offset is induced in the printed metrology features by modulating the dose.

Figure 14:
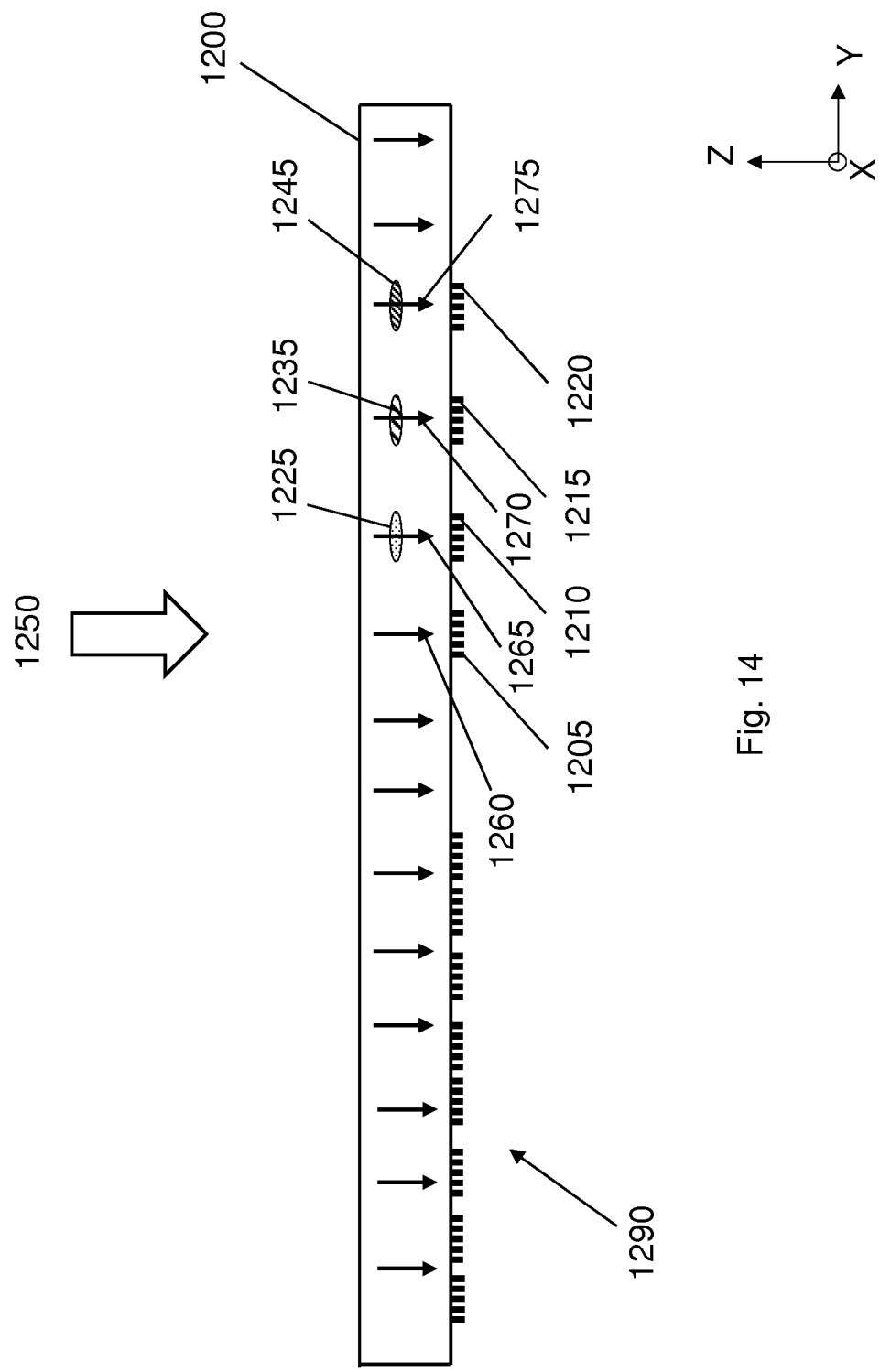
FIG. 14 schematically depict an example of a patterning device modified to have a transmission variation in a body of the patterning device and having a metrology target pattern at the variation.

Referring to FIG. 14, an example patterning device 1200 is depicted having a plurality of metrology target features 1205, 1210, 1215, 1220. In an embodiment, each of the metrology target features 1205, 1210, 1215, 1220 comprises a periodic structure (e.g., a grating). As will be appreciated, the metrology target features 1205, 1210, 1215, 1220 act to pattern the illumination radiation 1250, which patterned illumination radiation exposes a radiation-sensitive substrate to form metrology targets at the substrate. While FIG. 14 shows a transmissive patterning device 1200 for, e.g., DUV applications, the patterning device 1200 can be reflective for, e.g., EUV applications.

In an embodiment, the metrology target features 1205, 1210, 1215, 1220 are the same basic structure, e.g., a grating with a same pitch and feature size. So, identical dose targets can thus experience a controlled dose reduction among them. However, in an embodiment, one or more of the metrology target features 1205, 1210, 1215, 1220 can be different in structure from one or more other metrology target features 1205, 1210, 1215, 1220. While four features 1205, 1210, 1215, 1220 are depicted, in an embodiment, less or more than four features 1205, 1210, 1215, 1220 can be provided.

As seen in this example, one or more local transmission variations 1225, 1235, 1245 are provided in a path of the radiation 1250 toward the respective metrology target features 1210, 1215, 1220 to realize respective doses 1260, 1265, 1270, 1275 from the radiation 1250. In the embodiment depicted in FIG. 12, the dose of radiation 1260 would be the same as the dose of radiation 1250. But, while FIG. 12 doesn't show a local transmission variation in the path of the radiation 1260 toward the metrology target feature 1205, one can be provided there such that the dose of radiation 1260 is different than that of radiation 1250. In an embodiment, the local transmission variations 1225, 1235, 1245 can be of any magnitude provided that at least two are arranged so to create a dose offset between the associated target features. For example, in an embodiment, just one of doses 1260, 1265, 1270, 1275 can be different from the other doses or all the doses 1260, 1265, 1270, 1275 can be different. In an embodiment, a certain dose offset can be created between a first combination of features and a same dose offset can be provided by a second different combination of features (which second combination may share a feature with the first combination). In an embodiment, a certain dose offset can be created between a first combination of features and a different dose offset can be provided by a second different combination of features (which second combination may share a feature with the first combination). Further, while the one or more local transmission variations 1225, 1235, 1245 are provided in a path of the radiation 1250 toward the respective metrology target features 1210, 1215, 1220, they could be provided in a radiation path away from the respective metrology target features.

In an embodiment, the transmission of a patterning device substrate is modified to have at least one metrology target feature receive radiation at a different dose than another metrology target feature so as to create a dose offset between at least two metrology target features. In an embodiment, one or more local transmission variations 1225, 1235, 1245 are created by inducing one or more local transmission variations as discussed herein. So, in an embodiment, modification information is created to cause a patterning device modification apparatus to provide one or more local transmission variations 1225, 1235, 1245 at the appropriate locations so as to have a dose offset between metrology target features. So, in an embodiment, the local dose can be reduced by added scattering centers inside the substrate (e.g., quartz substrate) of a patterning device. In an embodiment, the dose reduction can be controlled by the amount and/or density of one or more local transmission variations (e.g., scattering centers). So, while the original dose of radiation 1250 (and of radiation 1260) can be at $I_0$, the dose reduction can be a multiple of $\Delta I$ (e.g., $I_0$-$\Delta I$, $I_0$-$2\Delta I$ and $I_0$-$3\Delta I$ respectively for local transmission variations 1225, 1235, 1245). In an embodiment, the one or more local transmission variations 1225, 1235, 1245 are provided when a feature 1205, 1210, 1215, 1220 is already located on the patterning device.

In an embodiment, the local transmission variation can be added outside the metrology target features area. A benefit would be to create a dose change around nominal, $I_{nom}$-n·$\Delta I$ and $I_{nom}$+n·$\Delta I$, wherein n corresponds to the amount of change desired. This would, for example, provide the ability to provide a greater range of dose offset. If such a background transmission variation is added to the patterning device, the exposure energy setting of the lithographic apparatus would go up to compensate for the scattered exposure radiation ($I_{nom}$>$I_0$).

In an embodiment, the patterning device can have a device pattern 1290. Thus, the features 1205, 1210, 1215, 1220 can be created with the formation of the device pattern 1290 on a substrate. By creating the metrology targets on the substrate along with a device pattern on the substrate created using the device pattern 1290, the metrology targets can accurately reflect the dose used to create the device pattern 1290 since the metrology targets on the substrate will have been created with the substantially same optical conditions (e.g., an essentially same dose received by the device pattern 1290 is received by the metrology target features except as modified by a controlled dose reduction as described above) as those used to create the device pattern on the substrate.

By having a dose offset between the metrology target features, a shift in dose will manifest as a change in a physical characteristic of at least one of the metrology features, which change in physical characteristic can be measured in terms of, e.g., measured CD of the metrology target features at the substrate, or measured reflectivity of the metrology target features at the substrate, etc. That is, in an embodiment, when the metrology target features are printed on the substrate, they will show a relative shift of their associated Bossung curves, which allows for, e.g., determination of a dose relative to a certain nominal dose used to image the patterning device to the substrate. For example, where there is a first metrology target feature and a second metrology target feature, by having enough dose offset between the first and second metrology target features, either the first metrology target or the second metrology target will be sufficiently from its designed dose at which it has a certain expected physical characteristic (e.g., an expected width of a grating line) at most, if not all, values of dose such that the physical characteristic of that metrology target feature as printed on the substrate will vary from its expected physical characteristic (e.g., a width of a grating line can become wider than its expected width and thus measured as a change in CD).

So, in an embodiment, first and second metrology target features having the dose offset at the patterning device are printed on the substrate using illumination and at a substantially same optical condition, i.e., at least a same dose setting. The printed first and second metrology target features are then measured to determine a value of a characteristic thereof (e.g., CD, reflectivity, etc.) for each of the printed first and second metrology target features. A difference in the values of the characteristic is then obtained and provides a signal of dose error. In an embodiment, the difference can be evaluated to determine a variation in dose from a certain nominal dose (e.g., the best dose) by, for example, reference to a correlation between the difference and the variation in dose or a calibration of the difference to a certain nominal dose. For example, if symmetrical dose behavior is assumed over a small dose range around the nominal dose, then a difference of zero can correspond to zero dose error and so a non-zero difference represents a dose error. Where more than two metrology target features are provided, the results of the values of the characteristic can be combined in various ways to produce a signal of the dose error. For example, a set of characteristic values can be differenced and another set of characteristic values can be differenced and then the two differences averaged. As will be appreciated, many different combinations are possible to arrive at a signal of the dose error.

The difference, the determined variation in dose or some other derived value therefrom can then be used in various applications. One such application is monitoring of dose to identify, for example, if a dose has met or exceeded a threshold. An additional or alternative such application is control of the patterning process (e.g., causing a change in a setting of a lithographic apparatus to change the dose).

In an embodiment, the dose offset between first and second metrology target features and the correlation between the difference in the measured characteristic of the printed first and second metrology target features and the variation in dose can be calibrated via a focus exposure matrix type process. For example, in the focus exposure matrix process, a potential set of first and second metrology target features can be printed at various different known dose values and then measured to determine whether the difference between the values of a characteristic (e.g., CD, reflectivity, etc.) for the printed first and second metrology target features varies with the dose changes and well enough at the expected dose and expected variation thereof. If there isn't a sufficient response, the offset can be varied and a new set of first and second metrology target features created and tested. Further, with expected set of first and second metrology target features, the expected set of first and second metrology target features can be printed at various different known dose values and then measured to determine the difference between the values of a characteristic (e.g., CD, reflectivity, etc.) for the printed first and second metrology target features. Those measured values of the difference can then be correlated with the known dose values to create the correlation between the difference in the measured characteristic of the printed first and second metrology target features and the variation in dose or to calibrate the difference to a certain nominal dose.

Figure 15:
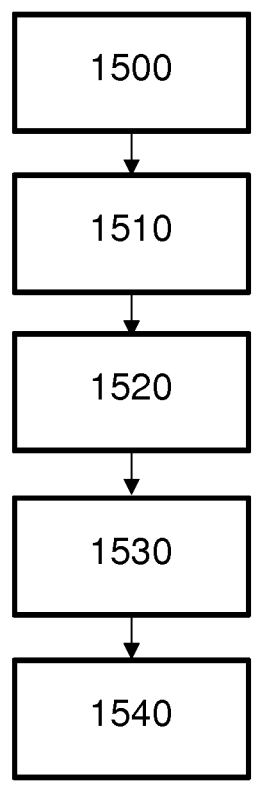
FIG. 15 schematically depicts a flow diagram of an embodiment of a method for patterning process parameter determination FIG. 16 schematically depicts an example inspection apparatus and metrology technique.

So, referring to FIG. 15, an example process of creating and using a set of first and second metrology target features for dose is depicted. At 1500, a set of first and second metrology target features are selected including determining the dose variation desired at the patterning device. A focus exposure matrix type process as described above can be used in selection of the set of first and second metrology target features. In an embodiment, a focus exposure matrix type process as described above can be used to derive a correlation between the difference in measured characteristics of the printed first and second metrology target features and variation in dose or a calibration of the difference to a certain nominal dose. While first and second metrology target features are described, there can be more metrology target features as described in relation to FIG. 14.

At 1510, modification information is created to modify the patterning device to physically create the one or more local transmission variations for the first and second metrology target features for the production patterning device, i.e., the patterning device used for control, monitoring, etc. of the patterning process (and which patterning device may have a device product pattern). The modification information is then used by a patterning device modification apparatus as described above to create one or more local transmission variations to provide the dose offset. The modification of the patterning device can be done before the patterning device is provided with the first and/or second metrology target feature or after the first and/or second metrology target feature is provided to the patterning device. In an embodiment, the first and second metrology target feature can be provided on a patterning device having a device product pattern.

At 1520, the set of first and second metrology target features are exposed on a substrate and then measured using, for example, a metrology apparatus such as depicted and described with respect to FIGS. 16-19 to obtain a value of a characteristic (e.g., CD, reflectivity, etc.) for each of the printed first and second metrology target features. As noted above, the characteristic varies with change of a physical characteristic of the printed first and second metrology target features due to dose change.

At 1530, a difference between the values of the characteristic (e.g., CD, reflectivity, etc.) for the printed first and second metrology target features is obtained from the measured characteristics. In an embodiment, the difference involves a subtraction. In an embodiment, the difference involves a different mathematical operation.

At 1540, the difference, a dose value corresponding to the difference (obtained using, e.g., the correlation described above) or some other derived parameter is used in an application. For example, in a monitoring application, the difference or the dose value can be compared to a threshold to determine whether a dose variation is out of specification. For example, a non-zero value of the difference can indicate a dose error. As another example, in a control application, the difference, the dose value or some other derived parameter can be used in control of an aspect of the patterning process (e.g., changing a setting of a lithographic apparatus) by, e.g., comparison against a threshold.

So, in an embodiment, there is provided a difference in dose between a first and a second metrology target feature using a local adaptation of a patterning device substrate. In an embodiment, that local adaptation is created by one or more local transmission variations (e.g., change in patterning device substrate density) provided to an interior of the patterning device substrate. Then, metrology applied to the metrology target features as exposed on the substrate is used to arrive at measured values of a characteristic, which values are used to signal or determine a local dose error.

In an embodiment then, there is provided a technique to determine lithographic apparatus dose, desirably from targets on a substrate having device patterns (e.g., to enable increased throughput and efficiency by not having to use a separate patterning device or use one or more send-ahead substrates that are not used to produce devices, to enable more accurate dose determination, etc.) made using a patterning device having the device pattern and the metrology target features to create the targets. Through use of such metrology target features, better dose control can be achieved and hence desirably realize higher yield, less rework in case of changes in the applied corrections, etc. Furthermore, in an embodiment, there is provided a self-calibrated solution (e.g., when using reflectivity differences) that may not require sometimes time-consuming target reconstruction.

So, in an embodiment, both dose and focus can be characterized. In an embodiment, set of metrology target features can be provided to a patterning device to enable determination of dose and focus. In an embodiment, both dose and focus can be controlled, e.g., in a feedback loop. That is, using both types of metrology target features (i.e., for focus and for dose), a focus exposure matrix type arrangement can be created on a product patterning device (and on product substrates) since both dose and focus can be determined. So, in an embodiment, the full dose/focus process window can be controlled in order to better enable printing of structures such as critical structures/hot spots.

Figure 16:
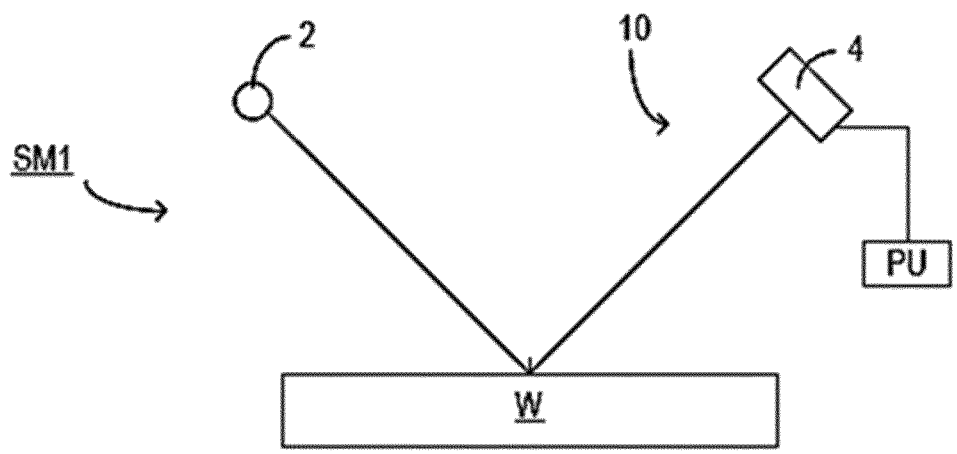
Figure 16:
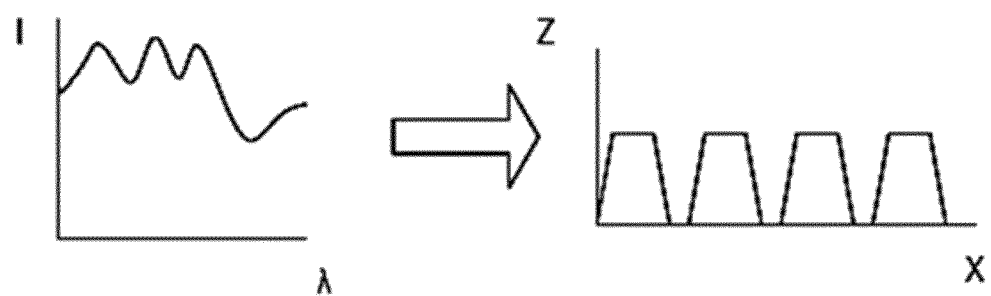

As noted above, the target can be measured using a diffraction-based metrology or inspection technique. FIG. 16 depicts an example inspection apparatus SM1 (e.g., a scatterometer) using a diffraction-based metrology or inspection technique. It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 16. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Figure 17:
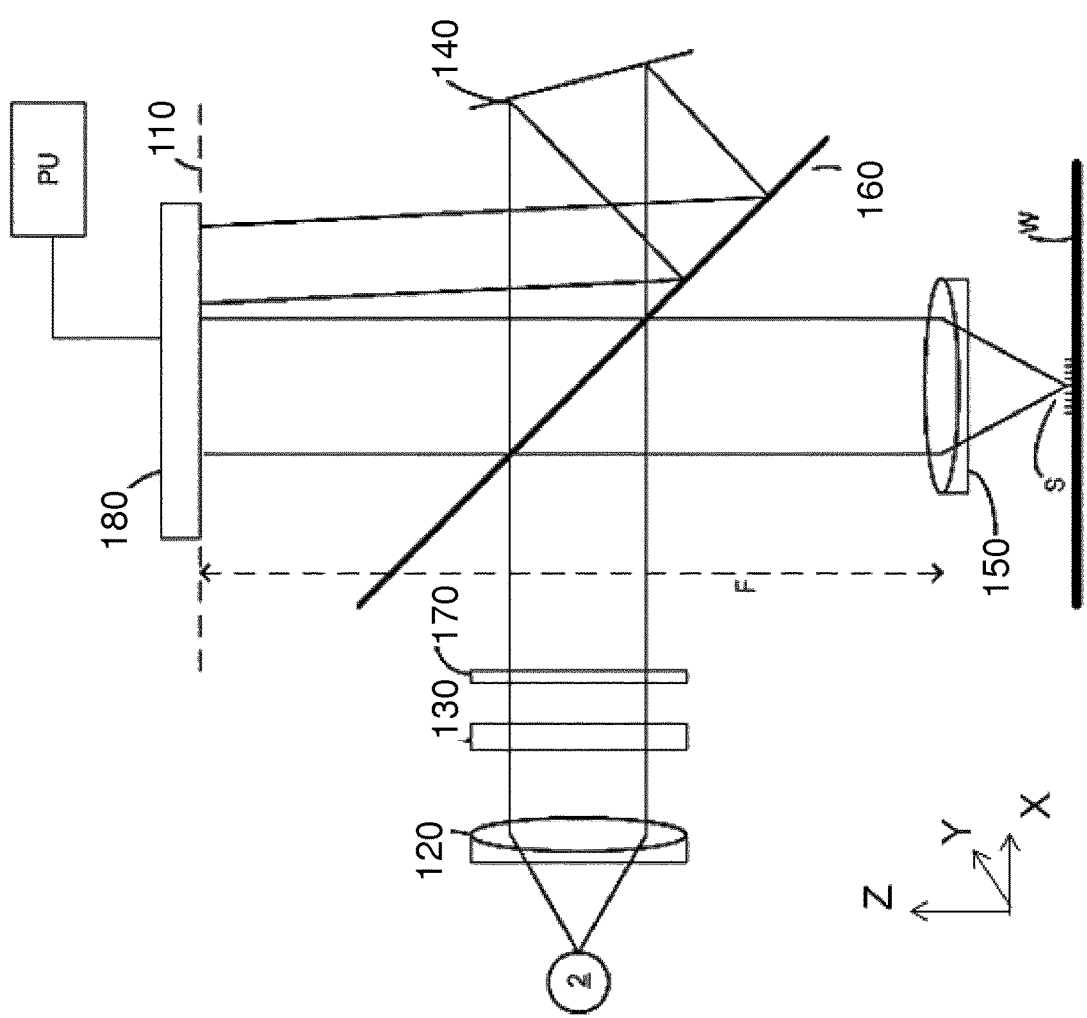
FIG. 17 schematically depicts an example inspection apparatus.

Another inspection apparatus that may be used is shown in FIG. 17. In this device, the radiation emitted by radiation source 2 is collimated using lens system 120 and transmitted through interference filter 130 and polarizer 170, reflected by partially reflecting surface 160 and is focused into a spot S on substrate W via an objective lens 150, which has a high numerical aperture (NA), desirably at least 0.9 or at least 0.95. An immersion inspection apparatus (using a relatively high refractive index fluid such as water) may even have a numerical aperture over 1.

The radiation redirected by the substrate W then passes through partially reflecting surface 160 into a detector 180 in order to have the spectrum detected. The detector 180 may be located at a back-projected focal plane 110 (i.e., at the focal length of the lens system 150) or the plane 110 may be re-imaged with auxiliary optics (not shown) onto the detector 180. The detector may be a two-dimensional detector so that a two-dimensional angular scatter spectrum of a substrate target 30 can be measured. The detector 180 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 160 part of it is transmitted through the partially reflecting surface 160 as a reference beam towards a reference mirror 140. The reference beam is then projected onto a different part of the same detector 180 or alternatively on to a different detector (not shown).

One or more interference filters 130 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 180 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, diffraction-based metrology or inspection can be used in the measurement of asymmetry of features in product and/or resist patterns. A particular application of asymmetry measurement is for the measurement of overlay, for example, but other applications are also known. In this case, the target 30 typically comprises one set of periodic features superimposed on another. For example, asymmetry can be measured by comparing opposite parts of the diffraction spectrum from the target 30 (for example, comparing the −1st and +1$^{St}$ orders in the diffraction spectrum of a periodic grating). The concepts of asymmetry measurement using the instrument of FIG. 16 or FIG. 17 are described, for example, in U.S. patent application publication US2006-066855, which is incorporated herein in its entirety by reference. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 17, where detector 180 may be an image sensor, such asymmetry in the diffraction orders appears directly as asymmetry in the pupil image recorded by detector 180. This asymmetry can be measured by digital image processing in unit PU, and calibrated against known values of overlay.

Figure 18:
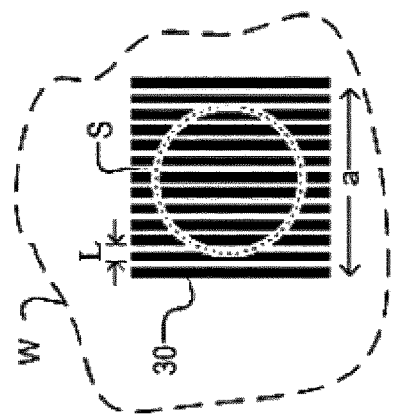
FIG. 18 illustrates the relationship between an illumination spot of an inspection apparatus and a metrology target.

FIG. 18 illustrates a plan view of a typical target 30 having lines and spaces having a pitch l', and the extent of illumination spot S in the apparatus of FIG. 17. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width 'a' and length of the target. The target in other words is 'underfilled' by the illumination, and the diffraction signal is essentially free from any signals from product features and the like outside the target itself. The illumination arrangement 2, 120, 130, 170 may be configured to provide illumination of a uniform intensity across a back focal plane of objective 150. Alternatively, by, e.g., including an aperture in the illumination path, illumination may be restricted to on axis or off axis directions.

Figure 19:
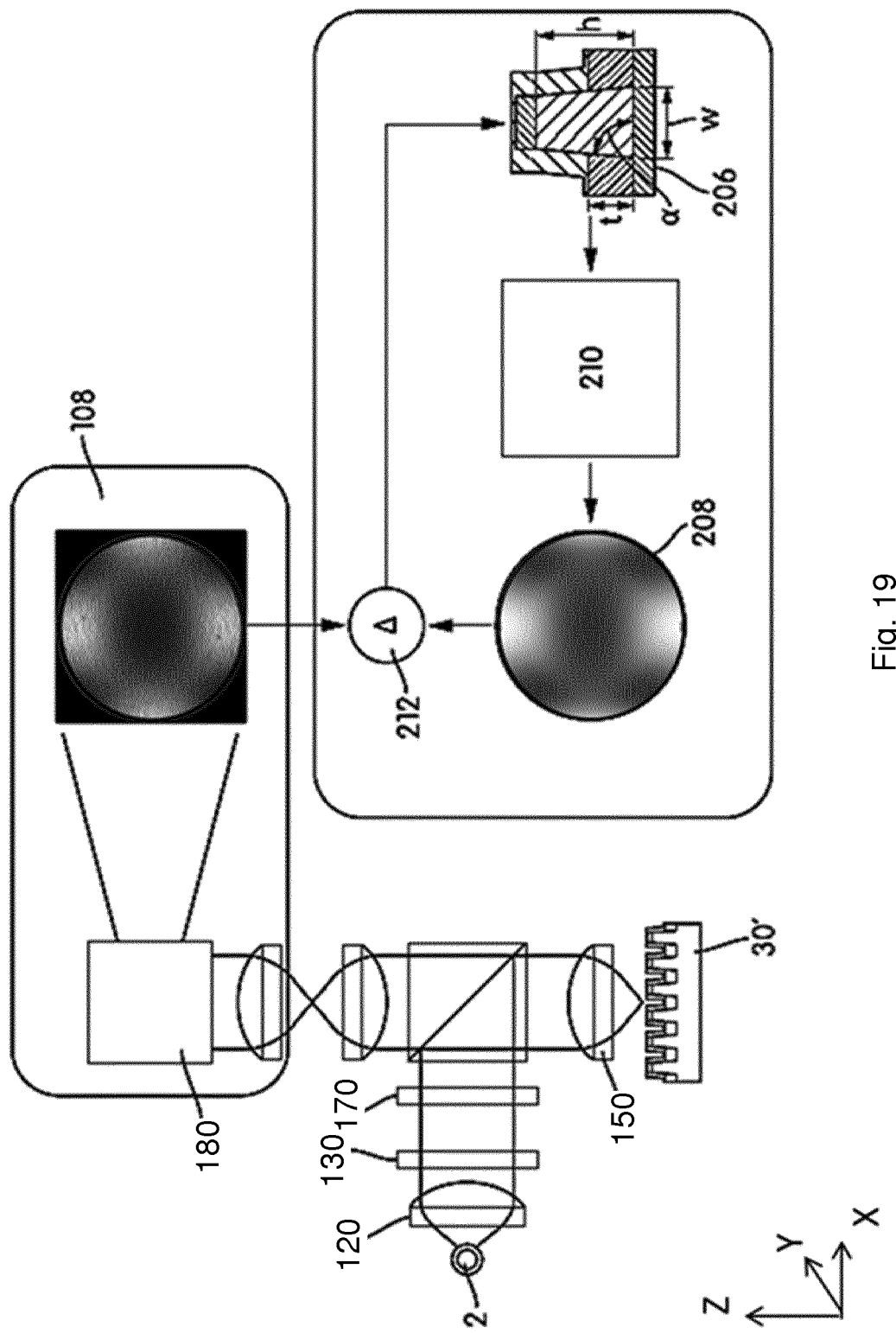
FIG. 19 schematically depicts a process of deriving a plurality of variables of interest based on measurement data.

FIG. 19 schematically depicts an example process of the determination of the value of one or more variables of interest of a target pattern 30' based on measurement data obtained using the metrology apparatus of FIG. 17. Radiation detected by the detector 180 provides a measured radiation distribution 108 for target 30'.

For a given target 30', a radiation distribution 208 can be computed/simulated from a parameterized model 206 using, for example, a numerical Maxwell solver 210. The parameterized model 206 shows example layers of various materials making up, and associated with, the target. The parameterized model 206 may include one or more of variables for the features and layers of the portion of the target under consideration, which may be varied and derived. As shown in FIG. 19, the one or more of the variables may include the thickness t of one or more layers, a width w (e.g., CD) of one or more features, a height h of one or more features, and/or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 108 is then compared at 212 to the computed radiation distribution 208 to determine the difference between the two. If there is a difference, the values of one or more of the variables of the parameterized model 206 may be varied, a new computed radiation distribution 208 calculated and compared against the measured radiation distribution 108 until there is sufficient match between the measured radiation distribution 108 and the computed radiation distribution 208. At that point, the values of the variables of the parameterized model 206 provide a good or best match of the geometry of the actual target 30'. In an embodiment, there is sufficient match when a difference between the measured radiation distribution 108 and the computed radiation distribution 208 is within a tolerance threshold.

In an embodiment, there is provided a method comprising: creating, by a computer system, modification information comprising a spatial distribution of induced local deformation elements and/or local transmission variations within, and displaced from a surface of, a body of the patterning device to modify a shape or profile of the patterning device, the modification information arranged to reduce a patterning error in a patterning system using the patterning device modified according to the modification information.

In an embodiment, the method further comprises determining shape or profile information of the patterning device and/or a patterning error by the patterning device, based on a measurement pertaining to the patterning device and the creating modification information comprises creating the modification information based on the shape information, profile information and/or patterning error. In an embodiment, the method further comprises obtaining measurements of registration error, a surface figure and/or focus data of the patterning device and wherein the determining the shape information, profile information and/or patterning error comprises determining the shape information, profile information and/or patterning error based on the measured registration error, surface figure and/or focus data. In an embodiment, the creating modification information to modify the patterning device comprises creating modification information to modify the patterning device to reduce a difference between the shape or profile of the patterning device and a nominal shape or profile. In an embodiment, the creating the modification information to modify the patterning device comprises creating modification information based on a substrate patterning error derived from measurement of a substrate exposed using the patterning device. In an embodiment, the method further comprises obtaining the substrate patterning error from measurement of patterns produced using the patterning device, modified according to the modification information, in the patterning system. In an embodiment, the method further comprises creating modification information for a modification apparatus of the patterning system. In an embodiment, the patterning error comprises focus non-uniformity within an image field of the patterning device. In an embodiment, the patterning error comprises an overlay error within an image field of the patterning device. In an embodiment, the modification information causes the patterning device to bend along an axis running through a central portion of the patterning device. In an embodiment, the modification information is arranged to reduce a non-correctable component of the patterning error. In an embodiment, the modification information is arranged to enhance a correction range of a modification apparatus in the patterning system. In an embodiment, there is provided a method comprising: reducing a focus and/or overlay error in a patterning system using a patterning device, by changing a profile of the patterning device by inducing a spatial distribution of local deformation elements and/or local transmission variations within, and displaced from a surface of, a body of the patterning device. In an embodiment, the method further comprises determining a deformed profile of the patterning device, determining a focus and/or overlay error associated with the deformed profile, and changing the profile based on the determined focus and/or overlay error. In an embodiment, changing the profile comprises using radiation to induce the local deformation elements and/or local transmission variations in the body of the patterning device. In an embodiment, the change in the profile is arranged to reduce a non-correctable component of the focus and/or overlay error. In an embodiment, the change in the profile is arranged to enhance a correction range of a modification apparatus in the patterning system.

In an embodiment, there is provided a system comprising: a hardware processor system; and a non-transitory computer readable storage medium storing machine-readable instructions, wherein when executed, the machine-readable instructions cause the processor system to creating modification information comprising a spatial distribution of induced local deformation elements and/or local transmission variations within, and displaced from a surface of, a body of the patterning device to modify the shape or profile of the patterning device, the modification information arranged to reduce a patterning error in a patterning system using the patterning device modified according to the modification information.

In an embodiment, the machine-readable instructions further cause the processor system to determine shape or profile information of the patterning device and/or a patterning error by the patterning device, based on a measurement pertaining to the patterning device and wherein the machine-readable instructions to cause the processor system to create modification information comprises machine-readable instructions to cause the processor system to create modification information based on the shape information, profile information and/or patterning error. In an embodiment, the system further comprises machine-readable instructions to cause the processor system to obtain measurements of registration error, a surface figure and/or focus data of the patterning device and the machine-readable instructions to cause the processor system to determine the shape or profile information of the patterning device and/or the patterning error by the patterning device comprises machine-readable instructions to cause the processor system to determine the shape information, profile information and/or patterning error based on the measured registration error, surface figure and/or focus data. In an embodiment, the machine-readable instructions to cause the processor system to create modification information to modify the patterning device comprises machine-readable instructions to cause the processor system to create modification information to modify the patterning device to reduce a difference between the shape or profile of the patterning device and a nominal shape or profile. In an embodiment, the machine-readable instructions to cause the processor system to create modification information to modify the patterning device comprises machine-readable instructions to cause the processor system to create modification information based on a substrate patterning error derived from measurement of a substrate exposed using the patterning device. In an embodiment, the system further comprises machine-readable instructions to cause the processor system to obtain the substrate patterning error from measurement of patterns produced using the patterning device, modified according the modification information, in the patterning system. In an embodiment, the system further comprises machine-readable instructions to cause the processor system to create modification information for a modification apparatus of the patterning system. In an embodiment, the patterning error comprises focus non-uniformity within an image field of the patterning device. In an embodiment, the patterning error comprises an overlay error within an image field of the patterning device. In an embodiment, the modification information causes the patterning device to bend along an axis running through a central portion of the patterning device. In an embodiment, the modification information is arranged to reduce a non-correctable component of the patterning error. In an embodiment, the modification information is arranged to enhance a correction range of a modification apparatus in the patterning system.

In an embodiment, there is provided a system comprising: a hardware processor system; and a non-transitory computer readable storage medium storing machine-readable instructions, wherein when executed, the machine-readable instructions cause the processor system to reduce a focus and/or overlay error in a patterning system using a patterning device, by changing a profile of the patterning device by inducing a spatial distribution of local deformation elements and/or local transmission variations within, and displaced from a surface of, a body of the patterning device.

In an embodiment, the machine-readable instructions are further configured to determine a deformed profile of the patterning device and determine a focus and/or overlay error associated with the deformed profile and wherein the machine-readable instructions that cause the processor system to change the profile are further configured to change the profile based on the determined focus and/or overlay error.

In an embodiment, there is provided a method comprising: obtaining data regarding an expected focus offset during a patterning process due to topography of a region of a substrate surface; and determining a modification of a transmission or reflection of a region of a patterning device associated with the region of the substrate surface based on the data, to mitigate an impact of the substrate topography on a parameter of the patterning process.

In an embodiment, the region of the substrate surface corresponds to a functional area of a device and the transmission or reflection modification is applied across the region of the patterning device associated with the functional area. In an embodiment, the determining the modification comprises determining a dose or dose offset to mitigate the impact of the expected focus offset. In an embodiment, the dose or dose offset is determined by simulating the exposure of a pattern feature in the region of the patterning device and the region of the substrate surface.

In an embodiment, the method further comprises modifying the patterning device based on the determined modification. In an embodiment, the method further comprises determining an optical proximity correction to a pattern of the patterning device to mitigate an impact of the substrate topography on a parameter of the patterning process. In an embodiment, the method further comprises determining a height variation for a mask blank of the patterning device to mitigate an impact of the substrate topography on a parameter of the patterning process. In an embodiment, the method further comprises determining the data regarding an expected focus offset by a mathematical model modeling at least a planarization process. In an embodiment, the method further comprises creating modification information for a modification apparatus of a patterning system of the patterning process.

In an embodiment, there is provided a system comprising: a hardware processor system; and a non-transitory computer readable storage medium storing machine-readable instructions, wherein when executed, the machine-readable instructions cause the processor system to obtain data regarding an expected focus offset during a patterning process due to topography of a region of a substrate surface, and determine a modification of a transmission or reflection of a region of a patterning device associated with the region of the substrate surface based on the data, to mitigate an impact of the substrate topography on a parameter of the patterning process.

In an embodiment, the region of the substrate surface corresponds to a functional area of a device and the transmission or reflection modification is applied across the region of the patterning device associated with the functional area. In an embodiment, the machine-readable instructions configured to determine the modification are further configured to determine a dose or dose offset to mitigate for impact of the expected focus offset. In an embodiment, the dose or dose offset is determined by simulating the exposure of a pattern feature in the region of the patterning device and the region of the substrate surface. In an embodiment, the machine-readable instructions are further configured to cause modification of the patterning device based on the determined modification. In an embodiment, the machine-readable instructions are further configured to determine an optical proximity correction to a pattern of the patterning device to mitigate an impact of the substrate topography on a parameter of the patterning process. In an embodiment, the machine-readable instructions are further configured to determine a height variation of a mask blank of the patterning device to mitigate an impact of the substrate topography on a parameter of the patterning process. In an embodiment, the machine-readable instructions are further configured to determine the data regarding an expected focus offset by a mathematical model modeling at least a planarization process. In an embodiment, the machine-readable instructions are further configured to create modification information for a modification apparatus of a patterning system of the patterning process.

In an embodiment, there is provided a method comprising: creating, by a computer system, modification information comprising one or more induced local deformation elements and/or local transmission variations within, and displaced from a surface of, a body of the patterning device, such that a radiation transmission and/or a distance to a focal plane at the location of a first metrology target feature on the patterning device is different from the radiation transmission and/or distance to a focal plane at the location of a second metrology target feature on the patterning device.

In an embodiment, the modification information comprises one or more induced local deformation elements such that a distance to a focal plane at the location of the first metrology target feature on the patterning device is different from the distance to a focal plane at the location of the second metrology target feature on the patterning device. In an embodiment, the first and second metrology target features form one or more focus sensitive metrology targets on a substrate. In an embodiment, the modification information comprises one or more local transmission variations within, and displaced from a surface of, a body of the patterning device, such that a radiation transmission of a first metrology target feature on the patterning device is different from the radiation transmission of a second metrology target feature on the patterning device. In an embodiment, the first and second metrology target features form one or more dose sensitive metrology targets on a substrate. In an embodiment, the patterning device further comprises a pattern corresponding to a device product. In an embodiment, the method further comprises reducing a patterning error in the patterning process based on a correction to a patterning system derived from a measurement of a substrate exposed using the patterning device modified according to the modification information. In an embodiment, the patterning error comprises a focus error. In an embodiment, the patterning error comprises a dose error. In an embodiment, the method further comprises modifying the patterning device according to the modification information to create the one or more induced local deformation elements and/or local transmission variations.

In an embodiment, there is provided a method comprising: exposing a first metrology target feature and a second metrology target feature on a patterning device to a substrate using a patterning process, wherein a radiation transmission and/or a distance to a focal plane at the location of the first metrology target feature is different from the radiation transmission and/or distance to a focal plane at the location of the second metrology target feature; and determining a value of a parameter associated with the patterning process based on measurement of a) a characteristic at a location of the substrate associated with the exposed first metrology target feature and b) a characteristic at a location of the substrate associated with the second metrology target feature.

In an embodiment, the patterning device comprises one or more induced local deformation elements such that the distance to the focal plane at the location of the first metrology target feature on the patterning device is different from the distance to the focal plane at the location of the second metrology target feature on the patterning device. In an embodiment, the first and second metrology target features form one or more focus sensitive metrology targets on the substrate. In an embodiment, the patterning device comprises one or more local transmission variations within, and displaced from a surface of, a body of the patterning device, such that the radiation transmission of the first metrology target feature is different from the radiation transmission of the second metrology target feature. In an embodiment, the first and second metrology target features form one or more dose sensitive metrology targets on a substrate. In an embodiment, the method further comprises reducing a patterning error in the patterning process based on a correction to a patterning system derived from the value of the parameter. In an embodiment, the patterning error comprises a focus error. In an embodiment, the patterning error comprises a dose error.

In an embodiment, there is provided a patterning device comprising a first metrology target feature, a second metrology target feature and one or more induced local deformation elements within, and displaced from a surface of, a body of the patterning device, such that a distance to a focal plane at the location of the first metrology target feature on the patterning device is different from the distance to a focal plane at the location of the second metrology target feature on the patterning device. In an embodiment, the patterning device further comprises a pattern corresponding to a device product.

In an embodiment, there is provided a patterning device comprising a first metrology target feature, a second metrology target feature and one or more local transmission variations within, and displaced from a surface of, a body of the patterning device, such that a radiation transmission at the location of the first metrology target feature on the patterning device is different from the radiation transmission at the location of the second metrology target feature on the patterning device. In an embodiment, the patterning device further comprises a pattern corresponding to a device product.

Figure 20:
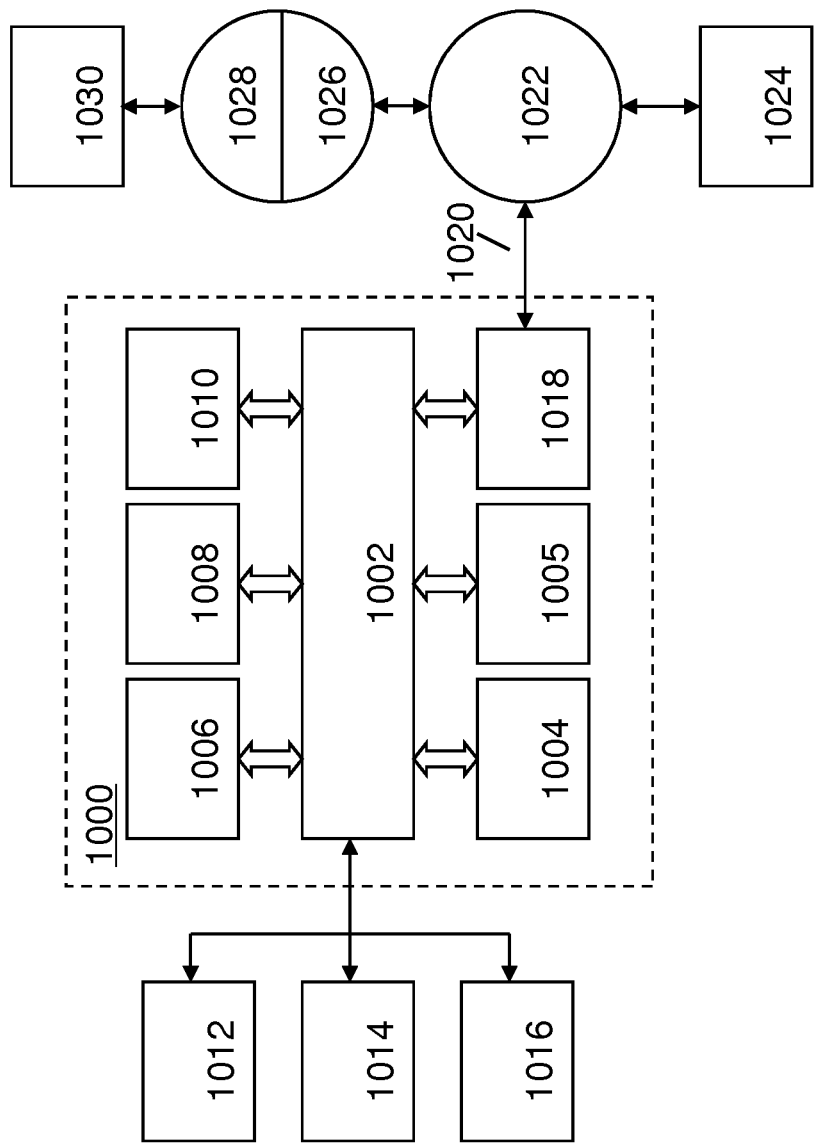
FIG. 20 schematically depicts a computer system which may implement embodiments of this disclosure.

Referring to FIG. 20, a computer system 1000 is shown. The computer system 1000 includes a bus 1002 or other communication mechanism for communicating information, and a processor 1004 (or multiple processors 1004 and 1005) coupled with bus 1002 for processing information. Computer system 1000 also includes a main memory 1006, such as a random access memory (RAM) or other dynamic storage device, coupled to bus 1002 for storing information and instructions to be executed by processor 1004. Main memory 1006 also may be used for storing temporary variables or other intermediate information during execution of instructions to be executed by processor 1004. Computer system 1000 further includes a read only memory (ROM) 1008 or other static storage device coupled to bus 1002 for storing static information and instructions for processor 1004. A storage device 1010, such as a magnetic disk or optical disk, is provided and coupled to bus 1002 for storing information and instructions.

Computer system 1000 may be coupled via bus 1002 to a display 1012, such as a cathode ray tube (CRT) or flat panel or touch panel display for displaying information to a computer user. An input device 1014, including alphanumeric and other keys, is coupled to bus 1002 for communicating information and command selections to processor 1004. Another type of user input device is cursor control 1016, such as a mouse, a trackball, or cursor direction keys for communicating direction information and command selections to processor 1004 and for controlling cursor movement on display 1012. This input device typically has two degrees of freedom in two axes, a first axis (e.g., x) and a second axis (e.g., y), that allows the device to specify positions in a plane. A touch panel (screen) display may also be used as an input device.

The computer system 1000 may be suitable to implement methods as described herein in response to processor 1004 executing one or more sequences of one or more instructions contained in main memory 1006. Such instructions may be read into main memory 1006 from another computer-readable medium, such as storage device 1010. Execution of the sequences of instructions contained in main memory 1006 causes processor 1004 to perform the process steps described herein. One or more processors in a multi-processing arrangement may also be employed to execute the sequences of instructions contained in main memory 1006. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 1004 for execution. Such a medium may take many forms, including but not limited to, non-volatile media, volatile media, and transmission media. Non-volatile media include, for example, optical or magnetic disks, such as storage device 1010. Volatile media include dynamic memory, such as main memory 1006. Transmission media include coaxial cables, copper wire and fiber optics, including the wires that comprise bus 1002. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1004 for execution. For example, the instructions may initially be borne on a magnetic disk of a remote computer. The remote computer can load the instructions into its dynamic memory and send the instructions over a telephone line using a modem. A modem local to computer system 1000 can receive the data on the telephone line and use an infrared transmitter to convert the data to an infrared signal. An infrared detector coupled to bus 1002 can receive the data carried in the infrared signal and place the data on bus 1002. Bus 1002 carries the data to main memory 1006, from which processor 1004 retrieves and executes the instructions. The instructions received by main memory 1006 may optionally be stored on storage device 1010 either before or after execution by processor 1004.

Computer system 1000 may also include a communication interface 1018 coupled to bus 1002. Communication interface 1018 provides a two-way data communication coupling to a network link 1020 that is connected to a local network 1022. For example, communication interface 1018 may be an integrated services digital network (ISDN) card or a modem to provide a data communication connection to a corresponding type of telephone line. As another example, communication interface 1018 may be a local area network (LAN) card to provide a data communication connection to a compatible LAN. Wireless links may also be implemented. In any such implementation, communication interface 1018 sends and receives electrical, electromagnetic or optical signals that carry digital data streams representing various types of information.

Network link 1020 typically provides data communication through one or more networks to other data devices. For example, network link 1020 may provide a connection through local network 1022 to a host computer 1024 or to data equipment operated by an Internet Service Provider (ISP) 1026. ISP 1026 in turn provides data communication services through the worldwide packet data communication network, now commonly referred to as the "Internet" 1028. Local network 1022 and Internet 1028 both use electrical, electromagnetic or optical signals that carry digital data streams. The signals through the various networks and the signals on network link 1020 and through communication interface 1018, which carry the digital data to and from computer system 1000, are exemplary forms of carrier waves transporting the information.

Computer system 1000 can send messages and receive data, including program code, through the network(s), network link 1020, and communication interface 1018. In the Internet example, a server 1030 might transmit a requested code for an application program through Internet 1028, ISP 1026, local network 1022 and communication interface 1018. In accordance with one or more embodiments, one such downloaded application provides for the illumination optimization of the embodiment, for example. The received code may be executed by processor 1004 as it is received, and/or stored in storage device 1010, or other non-volatile storage for later execution. In this manner, computer system 1000 may obtain application code in the form of a carrier wave.

An embodiment of the disclosure may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs. Although specific reference may be made in this text to the use of inspection apparatus in the manufacture of ICs, it should be understood that the inspection apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the disclosure in the context of optical lithography, it will be appreciated that the disclosure may be used in other applications, for example nanoimprint lithography, and where the context allows, is not limited to optical lithography. In the case of nanoimprint lithography, the patterning device is an imprint template or mold. The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

References herein to crossing or passing a threshold may include something having a value lower than a specific value or lower than or equal to a specific value, something having a value higher than a specific value or higher than or equal to a specific value, something being ranked higher or lower than something else (through e.g., sorting) based on, e.g., a parameter, etc.

References herein to correcting or corrections of an error include eliminating the error or reducing the error to within a tolerance range.

The term "optimizing" and "optimization" as used herein refers to or means adjusting a lithographic apparatus, a patterning process, etc. such that results and/or processes of lithography or patterning processing have more desirable characteristics, such as higher accuracy of projection of a design layout on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

In an optimization process of a system, a figure of merit of the system or process can be represented as a cost function. The optimization process boils down to a process of finding a set of parameters (design variables) of the system or process that optimizes (e.g., minimizes or maximizes) the cost function. The cost function can have any suitable form depending on the goal of the optimization. For example, the cost function can be weighted root mean square (RMS) of deviations of certain characteristics (evaluation points) of the system or process with respect to the intended values (e.g., ideal values) of these characteristics; the cost function can also be the maximum of these deviations (i.e., worst deviation). The term "evaluation points" herein should be interpreted broadly to include any characteristics of the system or process. The design variables of the system can be confined to finite ranges and/or be interdependent due to practicalities of implementations of the system or process. In the case of a lithographic apparatus or patterning process, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

While specific embodiments of the disclosure have been described above, it will be appreciated that the disclosure may be practiced otherwise than as described. For example, the disclosure may take the form of a computer program containing one or more sequences of machine-readable instructions describing a method as disclosed above, or a data storage medium (e.g. semiconductor memory, magnetic or optical disk) having such a computer program stored therein.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

Further embodiments of the invention are disclosed in the numbered clauses below:

1. A method comprising:
creating, by a computer system, modification information comprising a spatial distribution of induced local deformation elements and/or local transmission variations within, and displaced from a surface of, a body of the patterning device to modify a shape or profile of the patterning device, the modification information arranged to reduce a patterning error in a patterning system using the patterning device modified according to the modification information.

2. The method of clause 1, further comprising determining shape or profile information of the patterning device and/or a patterning error by the patterning device, based on a measurement pertaining to the patterning device and the creating modification information comprises creating the modification information based on the shape information, profile information and/or patterning error.

3. The method of clause 2, further comprising obtaining measurements of registration error, a surface figure and/or focus data of the patterning device and wherein the determining the shape information, profile information and/or patterning error comprises determining the shape information, profile information and/or patterning error based on the measured registration error, surface figure and/or focus data.

4. The method of any of clauses 1-3, wherein the creating modification information to modify the patterning device comprises creating modification information to modify the patterning device to reduce a difference between the shape or profile of the patterning device and a nominal shape or profile.

5. The method of any of clauses 1-4, wherein the creating the modification information to modify the patterning device comprises creating modification information based on a substrate patterning error derived from measurement of a substrate exposed using the patterning device.

6. The method of clause 5, further comprising obtaining the substrate patterning error from measurement of patterns produced using the patterning device, modified according to the modification information, in the patterning system.

7. The method of any of clauses 1-6, further comprising creating modification information for a modification apparatus of the patterning system.

8. The method of any of clauses 1-7, wherein the patterning error comprises focus non-uniformity within an image field of the patterning device.

9. The method of any of clauses 1-8, wherein the patterning error comprises an overlay error within an image field of the patterning device.

10. The method of any of clauses 1-9, wherein the modification information causes the patterning device to bend along an axis running through a central portion of the patterning device.

11. The method of any of clauses 1-10, wherein the modification information is arranged to reduce a non-correctable component of the patterning error.

12. The method of any of clauses 1-11, wherein the modification information is arranged to enhance a correction range of a modification apparatus in the patterning system.

13. A method comprising:
reducing a focus and/or overlay error in a patterning system using a patterning device, by changing a profile of the patterning device by inducing a spatial distribution of local deformation elements and/or local transmission variations within, and displaced from a surface of, a body of the patterning device.

14. The method of clause 13, further comprising determining a deformed profile of the patterning device, determining a focus and/or overlay error associated with the deformed profile, and changing the profile based on the determined focus and/or overlay error.

15. The method of clause 13 or clause 14, wherein changing the profile comprises using radiation to induce the local deformation elements and/or local transmission variations in the body of the patterning device.

16. The method of any of clauses 13-15, wherein the change in the profile is arranged to reduce a non-correctable component of the focus and/or overlay error.

17. The method of any of clauses 13-16, wherein the change in the profile is arranged to enhance a correction range of a modification apparatus in the patterning system.

18. A non-transitory computer program product comprising machine-readable instructions for causing a processor system to cause performance of the method of any of clauses 1-17.

19. A system comprising:
a hardware processor system; and
a non-transitory computer readable storage medium storing machine-readable instructions, wherein when executed, the machine-readable instructions cause the processor system to create modification information comprising a spatial distribution of induced local deformation elements and/or local transmission variations within, and displaced from a surface of, a body of the patterning device to modify the shape or profile of the patterning device, the modification information arranged to reduce a patterning error in a patterning system using the patterning device modified according to the modification information.

20. The system of clause 19, wherein the machine-readable instructions further cause the processor system to determine shape or profile information of the patterning device and/or a patterning error by the patterning device, based on a measurement pertaining to the patterning device and wherein the machine-readable instructions to cause the processor system to create modification information comprises machine-readable instructions to cause the processor system to create modification information based on the shape information, profile information and/or patterning error.

21. The system of clause 20, further comprising machine-readable instructions to cause the processor system to obtain measurements of registration error, a surface figure and/or focus data of the patterning device and the machine-readable instructions to cause the processor system to determine the shape or profile information of the patterning device and/or the patterning error by the patterning device comprises machine-readable instructions to cause the processor system to determine the shape information, profile information and/or patterning error based on the measured registration error, surface figure and/or focus data.

22. The system of any of clauses 19-21, wherein the machine-readable instructions to cause the processor system to create modification information to modify the patterning device comprises machine-readable instructions to cause the processor system to create modification information to modify the patterning device to reduce a difference between the shape or profile of the patterning device and a nominal shape or profile.

23. The system of any of clauses 19-22, wherein the machine-readable instructions to cause the processor system to create modification information to modify the patterning device comprises machine-readable instructions to cause the processor system to create modification information based on a substrate patterning error derived from measurement of a substrate exposed using the patterning device.

24. The system of clause 23, further comprising machine-readable instructions to cause the processor system to obtain the substrate patterning error from measurement of patterns produced using the patterning device, modified according the modification information, in the patterning system.

25. The system of any of clauses 19-24, further comprising machine-readable instructions to cause the processor system to create modification information for a modification apparatus of the patterning system.

26. The system of any of clauses 19-24, wherein the patterning error comprises focus non-uniformity within an image field of the patterning device.

27. The system of any of clauses 19-26, wherein the patterning error comprises an overlay error within an image field of the patterning device.

28. The system of any of clauses 19-27, wherein the modification information causes the patterning device to bend along an axis running through a central portion of the patterning device.

29. The system of any of clauses 19-28, wherein the modification information is arranged to reduce a non-correctable component of the patterning error.

30. The system of any of clauses 19-29, wherein the modification information is arranged to enhance a correction range of a modification apparatus in the patterning system.

31. A system comprising:
   a hardware processor system; and
   a non-transitory computer readable storage medium storing machine-readable instructions, wherein when executed, the machine-readable instructions cause the processor system to reduce a focus and/or overlay error in a patterning system using a patterning device, by changing a profile of the patterning device by inducing a spatial distribution of local deformation elements and/or local transmission variations within, and displaced from a surface of, a body of the patterning device.

32. The system of clause 31, wherein the machine-readable instructions are further configured to determine a deformed profile of the patterning device and determine a focus and/or overlay error associated with the deformed profile and wherein the machine-readable instructions that cause the processor system to change the profile are further configured to change the profile based on the determined focus and/or overlay error.

33. A method comprising:
   obtaining data regarding an expected focus offset during a patterning process due to topography of a region of a substrate surface; and
   determining a modification of a transmission or reflection of a region of a patterning device associated with the region of the substrate surface based on the data, to mitigate an impact of the substrate topography on a parameter of the patterning process.

34. The method of clause 33, wherein the region of the substrate surface corresponds to a functional area of a device and the transmission or reflection modification is applied across the region of the patterning device associated with the functional area.

35. The method of clause 33 or clause 34, wherein the determining the modification comprises determining a dose or dose offset to mitigate the impact of the expected focus offset.

36. The method of clause 35, wherein the dose or dose offset is determined by simulating the exposure of a pattern feature in the region of the patterning device and the region of the substrate surface.

37. The method of any of clauses 33-36, further comprising modifying the patterning device based on the determined modification.

38. The method of any of clauses 33-37, further comprising determining an optical proximity correction to a pattern of the patterning device to mitigate an impact of the substrate topography on a parameter of the patterning process.

39. The method of any of clauses 33-38, further comprising determining a height variation for a mask blank of the patterning device to mitigate an impact of the substrate topography on a parameter of the patterning process.

40. The method of any of clauses 33-39, further comprising determining the data regarding an expected focus offset by a mathematical model modeling at least a planarization process.

41. The method of any of clauses 33-40, further comprising creating modification information for a modification apparatus of a patterning system of the patterning process.

42. A non-transitory computer program product comprising machine-readable instructions for causing a processor system to cause performance of the method of any of clauses 33-41.

43. A system comprising:
   a hardware processor system; and
   a non-transitory computer readable storage medium storing machine-readable instructions, wherein when executed, the machine-readable instructions cause the processor system to obtain data regarding an expected focus offset during a patterning process due to topography of a region of a substrate surface, and determine a modification of a transmission or reflection of a region of a patterning device associated with the region of the substrate surface based on the data, to mitigate an impact of the substrate topography on a parameter of the patterning process.

44. The system of clause 43, wherein the region of the substrate surface corresponds to a functional area of a device and the transmission or reflection modification is applied across the region of the patterning device associated with the functional area.

45. The system of clause 43 or clause 44, wherein the machine-readable instructions configured to determine the modification are further configured to determine a dose or dose offset to mitigate for impact of the expected focus offset.

46. The system of clause 45, wherein the dose or dose offset is determined by simulating the exposure of a pattern feature in the region of the patterning device and the region of the substrate surface.

47. The system of any of clauses 43-46, wherein the machine-readable instructions are further configured to cause modification of the patterning device based on the determined modification.

48. The system of any of clauses 43-47, wherein the machine-readable instructions are further configured to determine an optical proximity correction to a pattern of the patterning device to mitigate an impact of the substrate topography on a parameter of the patterning process.

49. The system of any of clauses 43-48, wherein the machine-readable instructions are further configured to determine a height variation of a mask blank of the patterning device to mitigate an impact of the substrate topography on a parameter of the patterning process.

50. The system of any of clauses 43-49, wherein the machine-readable instructions are further configured to determine the data regarding an expected focus offset by a mathematical model modeling at least a planarization process.

51. The system of any of clauses 43-50, wherein the machine-readable instructions are further configured to create modification information for a modification apparatus of a patterning system of the patterning process.

52. A method comprising:
   creating, by a computer system, modification information comprising one or more induced local deformation elements and/or local transmission variations within, and displaced from a surface of, a body of the patterning device, such that a radiation transmission and/or a distance to a focal plane at the location of a first metrology target feature on the patterning device is different from the radiation transmission and/or distance to a focal plane at the location of a second metrology target feature on the patterning device.

53. The method of clause 52, wherein the modification information comprises one or more induced local deformation elements such that a distance to a focal plane at the location of the first metrology target feature on the patterning device is different from the distance to a focal plane at the location of the second metrology target feature on the patterning device.

54. The method of clause 53, wherein the first and second metrology target features form one or more focus sensitive metrology targets on a substrate.

55. The method of any of clauses 52-54, wherein the modification information comprises one or more local transmission variations within, and displaced from a surface of, a body of the patterning device, such that a radiation transmission of a first metrology target feature on the patterning device is different from the radiation transmission of a second metrology target feature on the patterning device.

56. The method of clause 55, wherein the first and second metrology target features form one or more dose sensitive metrology targets on a substrate.

57. The method of any of clauses 52-56, wherein the patterning device further comprises a pattern corresponding to a device product.

58. The method of any of clauses 52-57, further comprising reducing a patterning error in the patterning process based on a correction to a patterning system derived from a measurement of a substrate exposed using the patterning device modified according to the modification information.

59. The method of clause 58, wherein the patterning error comprises a focus error.

60. The method of clause 58 or clause 59, wherein the patterning error comprises a dose error.

61. The method of any of clauses 52-60, further comprising modifying the patterning device according to the modification information to create the one or more induced local deformation elements and/or local transmission variations.

62. A method comprising:
 exposing a first metrology target feature and a second metrology target feature on a patterning device to a substrate using a patterning process, wherein a radiation transmission and/or a distance to a focal plane at the location of the first metrology target feature is different from the radiation transmission and/or distance to a focal plane at the location of the second metrology target feature; and
 determining a value of a parameter associated with the patterning process based on measurement of a) a characteristic at a location of the substrate associated with the exposed first metrology target feature and b) a characteristic at a location of the substrate associated with the second metrology target feature.

63. The method of clause 62, wherein the patterning device comprises one or more induced local deformation elements such that the distance to the focal plane at the location of the first metrology target feature on the patterning device is different from the distance to the focal plane at the location of the second metrology target feature on the patterning device.

64. The method of clause 63, wherein the first and second metrology target features form one or more focus sensitive metrology targets on the substrate.

65. The method of any of clauses 62-64, wherein the patterning device comprises one or more local transmission variations within, and displaced from a surface of, a body of the patterning device, such that the radiation transmission of the first metrology target feature is different from the radiation transmission of the second metrology target feature.

66. The method of clause 65, wherein the first and second metrology target features form one or more dose sensitive metrology targets on a substrate.

67. The method of any of clauses 62-66, further comprising reducing a patterning error in the patterning process based on a correction to a patterning system derived from the value of the parameter.

68. The method of clause 67, wherein the patterning error comprises a focus error.

69. The method of clause 67 or clause 68, wherein the patterning error comprises a dose error.

70. A non-transitory computer program product comprising machine-readable instructions for causing a processor system to cause performance of the method of any of clauses 52-69.

71. A patterning device modified according to the method of any of clauses 52-61 or used according to the method of any of clauses 62-69.

72. A patterning device comprising a first metrology target feature, a second metrology target feature and one or more induced local deformation elements within, and displaced from a surface of, a body of the patterning device, such that a distance to a focal plane at the location of the first metrology target feature on the patterning device is different from the distance to a focal plane at the location of the second metrology target feature on the patterning device.

73. The patterning device of clause 72, further comprising a pattern corresponding to a device product.

74. A patterning device comprising a first metrology target feature, a second metrology target feature and one or more local transmission variations within, and displaced from a surface of, a body of the patterning device, such that a radiation transmission at the location of the first metrology target feature on the patterning device is different from the radiation transmission at the location of the second metrology target feature on the patterning device.

75. The patterning device of clause 74, further comprising a pattern corresponding to a device product.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

The descriptions above are intended to be illustrative, not limiting. Thus, it will be apparent to one skilled in the art that modifications may be made to the disclosure as described without departing from the scope of the claims set out below.

What is claimed is:

1. A method comprising:
creating, by a computer system, modification information comprising one or more induced local deformation elements and/or local transmission variations within, and displaced from a surface of, a body of the patterning device, such that a radiation transmission and/or a distance to a focal plane at the location of a first metrology target feature on the patterning device is different from the radiation transmission and/or distance to a focal plane at the location of a second metrology target feature on the patterning device.

2. The method of claim 1, wherein the modification information comprises one or more induced local deformation elements such that a distance to a focal plane at the location of the first metrology target feature on the patterning device is different from the distance to a focal plane at the location of the second metrology target feature on the patterning device.

3. The method of claim 2, wherein the first and second metrology target features form one or more focus sensitive metrology targets on a substrate.

4. The method of claim 1, wherein the modification information comprises one or more local transmission variations within, and displaced from a surface of, a body of the patterning device, such that a radiation transmission of a first metrology target feature on the patterning device is different from the radiation transmission of a second metrology target feature on the patterning device.

5. The method of claim 4, wherein the first and second metrology target features form one or more dose sensitive metrology targets on a substrate.

6. The method of claim 1, wherein the patterning device further comprises a pattern corresponding to a device product.

7. The method of claim 1, further comprising reducing a patterning error in the patterning process based on a correction to a patterning system derived from a measurement of a substrate exposed using the patterning device modified according to the modification information.

8. The method of claim 7, wherein the patterning error comprises a focus error and/or a dose error.

9. The method of claim 1, further comprising modifying the patterning device according to the modification information to create the one or more induced local deformation elements and/or local transmission variations.

10. A non-transitory computer program product comprising machine-readable instructions for causing a processor system to cause at least performance of the method of claim 1.

11. A patterning device modified according to the method of claim 1.

12. A method comprising:
exposing a first metrology target feature and a second metrology target feature on a patterning device to a substrate using a patterning process, wherein a radiation transmission and/or a distance to a focal plane at the location of the first metrology target feature is different from the radiation transmission and/or distance to a focal plane at the location of the second metrology target feature; and
determining a value of a parameter associated with the patterning process based on measurement of a) a characteristic at a location of the substrate associated with the exposed first metrology target feature and b) a characteristic at a location of the substrate associated with the second metrology target feature.

13. The method of claim 12, wherein the patterning device comprises one or more local transmission variations within, and displaced from a surface of, a body of the patterning device, such that the radiation transmission of the first metrology target feature is different from the radiation transmission of the second metrology target feature.

14. The method of claim 12, further comprising reducing a patterning error in the patterning process based on a correction to a patterning system derived from the value of the parameter.

15. The method of claim 12, wherein the patterning device comprises one or more induced local deformation elements such that the distance to the focal plane at the location of the first metrology target feature on the patterning device is different from the distance to the focal plane at the location of the second metrology target feature on the patterning device.

16. The method of claim 15, wherein the first and second metrology target features form one or more focus sensitive metrology targets on the substrate.

17. A patterning device comprising a first metrology target feature, a second metrology target feature and one or more induced local deformation elements within, and displaced from a surface of, a body of the patterning device, such that a distance to a focal plane at the location of the first metrology target feature on the patterning device is different from the distance to a focal plane at the location of the second metrology target feature on the patterning device.

18. The patterning device of claim 17, further comprising a pattern corresponding to a device product.

19. A patterning device comprising a first metrology target feature, a second metrology target feature and one or more local transmission variations within, and displaced from a surface of, a body of the patterning device, such that a radiation transmission at the location of the first metrology target feature on the patterning device is different from the radiation transmission at the location of the second metrology target feature on the patterning device.

20. The patterning device of claim 19, further comprising a pattern corresponding to a device product.

* * * * *